US012051371B2

(12) United States Patent
Kim et al.

(10) Patent No.: US 12,051,371 B2
(45) Date of Patent: Jul. 30, 2024

(54) GATE DRIVING CIRCUIT HAVING A COMMON SENSING CIRCUIT FOR CONTROLLING SCAN DRIVING CIRCUITS AND DISPLAY DEVICE THEREOF

(71) Applicant: LG Display Co., Ltd., Seoul (KR)

(72) Inventors: KwangSoo Kim, Seoul (KR); YongHo Kim, Seoul (KR); Jaesung Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/066,759

(22) Filed: Dec. 15, 2022

(65) Prior Publication Data
US 2023/0215380 A1 Jul. 6, 2023

(30) Foreign Application Priority Data
Dec. 31, 2021 (KR) .................. 10-2021-0194519

(51) Int. Cl.
*G09G 3/3266* (2016.01)
*G09G 3/32* (2016.01)

(52) U.S. Cl.
CPC ............. *G09G 3/3266* (2013.01); *G09G 3/32* (2013.01); *G09G 2310/0267* (2013.01); *G09G 2310/0291* (2013.01); *G09G 2310/061* (2013.01)

(58) Field of Classification Search
CPC ..................................... G09G 3/3266
USPC ........................................................ 345/76
See application file for complete search history.

(56) References Cited

U.S. PATENT DOCUMENTS

2018/0337682 A1* 11/2018 Takasugi ................ H03K 21/18
2021/0201770 A1* 7/2021 Park ........................ G11C 19/28
2022/0208105 A1* 6/2022 Lee ....................... G09G 3/3266

* cited by examiner

*Primary Examiner* — Long D Pham
(74) *Attorney, Agent, or Firm* — Seed IP Law Group LLP

(57) ABSTRACT

According to embodiments of the disclosure, a gate driving circuit and a display device may include four buffer groups for driving 4k scan lines, two common logic units for controlling the four buffer groups, and a common sensing circuit controlling to output a sensing driving scan signal to at least one scan line among the 4k scan lines. Thus, it is possible to allow the gate driving circuit to have a low-area structure and to reduce the bezel area of the display device.

28 Claims, 17 Drawing Sheets

S-MODE

Vsen Wave

*F-MODE*

*Vsen Wave*

GATE DRIVING CIRCUIT HAVING A COMMON SENSING CIRCUIT FOR CONTROLLING SCAN DRIVING CIRCUITS AND DISPLAY DEVICE THEREOF

CROSS-REFERENCE TO RELATED APPLICATION

This application claims priority from Korean Patent Application No. 10-2021-0194519, filed on Dec. 31, 2021, which is hereby incorporated by reference for all purposes as if fully set forth herein.

BACKGROUND

Technical Field

Embodiments of the disclosure relate to a gate driving circuit and a display device.

Description of Related Art

As the information society develops, demand for display devices for displaying images is increasing in various forms. Various display devices, such as liquid crystal display devices and organic light emitting display devices, are being utilized in recent years.

For image display, a display device may include a display panel where a plurality of data lines and a plurality of gate lines are disposed, a data driving circuit outputting data signals to the plurality of data lines, and a gate driving circuit outputting gate signals to the plurality of gate lines.

When the size of the display panel increases or the number and types of gate lines increase for various reasons, the size of the gate driving circuit may increase.

In the display field, the size of the display panel is increased or the number and types of gate lines are increased for various reasons, and thus the size of the gate driving circuit is increased. When the gate driving circuit is embedded in the display panel, the size of the bezel of the display device may increase. Accordingly, the inventors of the disclosure have invented a gate driving circuit and a display device that may be designed in a small area while having a normal driving function.

BRIEF SUMMARY

Accordingly, embodiments of the disclosure may provide a gate driving circuit having a low-area structure and a display device including the same.

Embodiments of the disclosure may provide a gate driving circuit having a low-area structure while normally performing a gate driving operation for sensing the mobility of a driving transistor in a subpixel and a display device including the same.

According to embodiments of the disclosure, a gate driving circuit may comprise a first scan driving circuit for outputting an nth to (n+k−1)th scan signal to an nth to (n+k−1)th scan line, a second scan driving circuit for outputting an (n+k)th to (n+2k−1)th scan signal to an (n+k)th to (n+2k−1)th scan line, a third scan driving circuit for outputting an (n+2k)th to (n+3k−1)th scan signal to an (n+2k)th to (n+3k−1)th scan line, a fourth scan driving circuit for outputting an (n+3k)th to (n+4k−1)th scan signal to an (n+3k)th to (n+4k−1)th scan line, and a common sensing circuit COM_RTS commonly connected with the first scan driving circuit, the second scan driving circuit, the third scan driving circuit, and the fourth scan driving circuit and receiving a line selection signal to output a first common control signal and a second common control signal to the first to fourth scan driving circuits.

According to embodiments of the disclosure, in the gate driving circuit, n may be a natural number of 1 or more, and k may be a natural number of 2 or more. During a sensing driving period, one of the first to fourth scan driving circuits may output a scan signal to a corresponding scan line among 4k scan lines after a reset signal is input.

According to embodiments of the disclosure, a display device may comprise a display panel including a plurality of scan lines and a plurality of subpixels and a gate driving circuit disposed in a non-display area of the display panel and driving the plurality of scan lines.

According to embodiments of the disclosure, a gate driving circuit may comprise a first scan driving circuit for outputting an nth to (n+k−1)th scan signal to an nth to (n+k−1)th scan line, a second scan driving circuit for outputting an (n+k)th to (n+2k−1)th scan signal to an (n+k)th to (n+2k−1)th scan line, a third scan driving circuit for outputting an (n+2k)th to (n+3k−1)th scan signal to an (n+2k)th to (n+3k−1)th scan line, a fourth scan driving circuit for outputting an (n+3k)th to (n+4k−1)th scan signal to an (n+3k)th to (n+4k−1)th scan line, and a common sensing circuit COM_RTS commonly connected with the first scan driving circuit, the second scan driving circuit, the third scan driving circuit, and the fourth scan driving circuit and receiving a line selection signal to output a first common control signal and a second common control signal to the first to fourth scan driving circuits.

According to embodiments of the disclosure, in the gate driving circuit, n may be a natural number of 1 or more, and k may be a natural number of 2 or more. During a sensing driving period, one of the first to fourth scan driving circuits may output a scan signal to a corresponding scan line among 4k scan lines after a reset signal is input.

According to embodiments of the disclosure, a gate driving circuit may comprise four buffer groups for driving 4k scan lines, two common logic units for controlling the four buffer groups, and a common sensing circuit controlling to output a sensing driving scan signal to at least one scan line among the 4k scan lines.

According to embodiments of the disclosure, there may be provided a gate driving circuit having a low-area structure and a display device including the same.

According to embodiments of the disclosure, there may be provided a gate driving circuit having a low-area structure while normally performing a gate driving operation for sensing the mobility of a driving transistor in a subpixel and a display device including the same.

DESCRIPTION OF THE SEVERAL VIEWS OF THE DRAWINGS

The technical benefits, features, and advantages of the present disclosure will be more clearly understood from the following detailed description, taken in conjunction with the accompanying drawings, in which.

DETAILED DESCRIPTION

Figure 1:
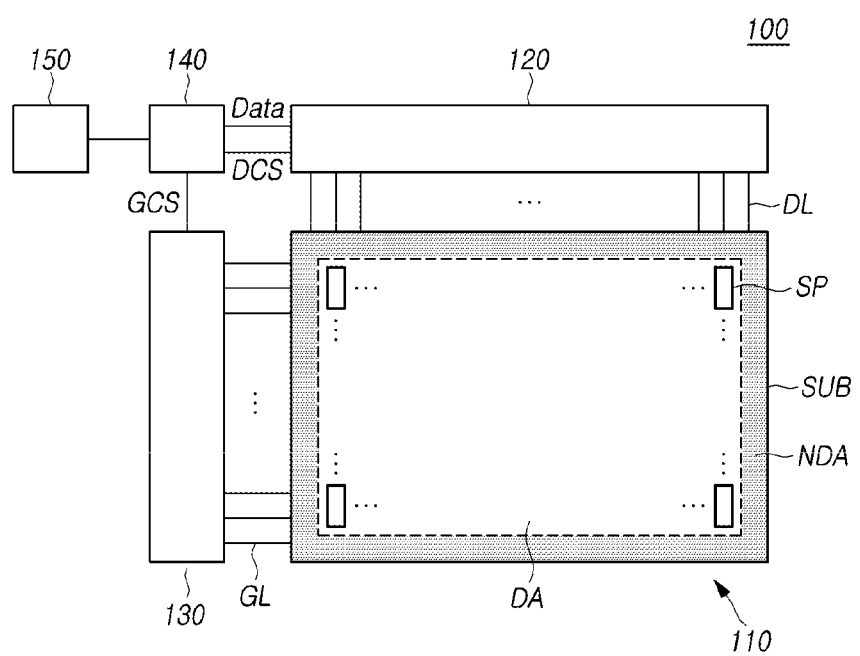
FIG. 1 is a view illustrating a configuration of a display device according to embodiments of the disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present invention. Each of these terms is not used to define essence, order, sequence, or number of elements, etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

Hereinafter, various embodiments of the present disclosure are described in detail with reference to the accompanying drawings.

FIG. 1 is a view illustrating a configuration of a display device 100 according to embodiments of the disclosure.

Referring to FIG. 1, a display device 100 according to embodiments of the disclosure may include a display panel 110 and driving circuits for driving the display panel 110.

The driving circuits may include a data driving circuit 120 and a gate driving circuit 130. The display device 100 may further include a controller 140 controlling the data driving circuit 120 and the gate driving circuit 130.

The display panel 110 may include a substrate SUB and signal lines, such as a plurality of data lines DL and a plurality of gate lines GL disposed on the substrate SUB. The display panel 110 may include a plurality of subpixels SP connected to the plurality of data lines DL and the plurality of gate lines GL.

The display panel 110 may include a display area DA in which images are displayed and a non-display area NDA in which no image is displayed. In the display panel 110, a plurality of subpixels SP for displaying images may be disposed in the display area DA, and the driving circuits 120, 130, and 140 may be electrically connected or disposed in the non-display area NDA. Further, pad units for connection of integrated circuits or a printed circuit may be disposed in the non-display area NA.

The data driving circuit 120 is a circuit for driving the plurality of data lines DL, and may supply data signals to the plurality of data lines DL. The gate driving circuit 130 is a circuit for driving the plurality of gate lines GL, and may supply gate signals to the plurality of gate lines GL. The controller 140 may supply a data control signal DCS to the data driving circuit 120 to control the operation timing of the data driving circuit 120. The controller 140 may supply a gate control signal GCS for controlling the operation timing of the gate driving circuit 130 to the gate driving circuit 130.

The controller 140 may start scanning according to a timing implemented in each frame, convert input image data input from the outside into image data Data suited for the data signal format used in the data driving circuit 120, supply the image data Data to the data driving circuit 120, and control data driving at an appropriate time suited for scanning.

The controller 140 receives, from the outside (e.g., a host system 150), various timing signals including a vertical synchronization signal VSYNC, a horizontal synchronization signal HSYNC, an input data enable signal DE, and a clock signal, along with the input image data.

To control the data driving circuit 120 and the gate driving circuit 130, the controller 140 receives timing signals, such as the vertical synchronization signal VSYNC, horizontal synchronization signal HSYNC, input data enable signal DE, and clock signal CLK, generates various control signals DCS and GCS, and outputs the control signals to the data driving circuit 120 and the gate driving circuit 130.

As an example, to control the gate driving circuit 130, the controller 140 outputs various gate control signals GCS including a gate start pulse GSP, a gate shift clock GSC, and a gate output enable signal (Gate Output Enable, GOE).

To control the data driving circuit 120, the controller 140 outputs various data control signals DCS including, e.g., a source start pulse SSP, a source sampling clock SSC, and a source output enable signal (Source Output Enable, SOE).

The controller 140 may be implemented as a separate component from the data driving circuit 120, or the controller 140, along with the data driving circuit 120, may be implemented as an integrated circuit.

The data driving circuit 120 receives the image data Data from the controller 140 and supply data voltages to the plurality of data lines DL, thereby driving the plurality of data lines DL. The data driving circuit 120 is also referred to as a 'source driving circuit.'

The data driving circuit 120 may include one or more source driver integrated circuit (SDICs).

Each source driver integrated circuit (SDIC) may include a shift register, a latch circuit, a digital-to-analog converter (DAC), and an output buffer. In some cases, each source driver integrated circuit (SDIC) may further include an analog-digital converter ADC.

For example, each source driver integrated circuit (SDIC) may be connected with the display panel 110 by a tape automated bonding (TAB) method or connected to a bonding pad of the display panel 110 by a chip on glass (COG) or chip on panel (COP) method or may be implemented by a chip on film (COF) method and connected with the display panel 110.

The gate driving circuit 130 may output a gate signal of a turn-on level voltage or a gate signal of a turn-off level voltage according to the control of the controller 140. The gate driving circuit 130 may sequentially drive the plurality of gate lines GL by sequentially supplying gate signals of the turn-on level voltage to the plurality of gate lines GL.

The gate driving circuit 130 may be connected with the display panel 110 by TAB method or connected to a bonding pad of the display panel 110 by a COG or COP method or may be connected with the display panel 110 according to a COF method. Alternatively and additionally, the gate driving circuit 130 may be formed in a gate in panel (GIP) type, in the non-display area NDA of the display panel 110. The gate driving circuit 130 may be disposed on the substrate SUB or may be connected to the substrate SUB. In other words, the gate driving circuit 130 that is of a GIP type may be disposed in the non-display area NDA of the substrate SUB. The gate driving circuit 130 that is of a chip-on-glass (COG) type or chip-on-film (COF) type may be connected to the substrate SUB.

Meanwhile, at least one of the data driving circuit 120 and the gate driving circuit 130 may be disposed in the display area DA. For example, at least one of the data driving circuit 120 and the gate driving circuit 130 may be disposed not to overlap the subpixels SP or to overlap all or some of the subpixels SP. But embodiments of the present disclosure are not limited thereto. For example, both of the data driving circuit 120 and the gate driving circuit 130 may be disposed outside of the display area DA.

When a specific gate line GL is turned on by the gate driving circuit 130, the data driving circuit 120 may convert the image data Data received from the controller 140 into an analog data voltage and supply it to the plurality of data lines DL.

The data driving circuit 120 may be connected to one side (e.g., an upper or lower side) of the display panel 110. Depending on the driving scheme or the panel design scheme, data driving circuits 120 may be connected with two sides (e.g., both the upper and lower sides) of the display panel 110, or two or more of the four sides of the display panel 110.

The gate driving circuit 130 may be connected to one side (e.g., a left or right side) of the display panel 110. Depending on the driving scheme or the panel design scheme, gate driving circuits 130 may be connected with two sides (e.g., both the left and right sides) of the display panel 110, or two or more of the four sides of the display panel 110.

The controller 140 may be a timing controller used in typical display technology, a control device that may perform other control functions as well as the functions of the timing controller, or a control device other than the timing controller, or may be a circuit in the control device. The controller 140 may be implemented as various circuits or electronic components, such as an integrated circuit (IC), a field programmable gate array (FPGA), an application specific integrated circuit (ASIC), or a processor.

The controller 140 may be mounted on a printed circuit board or a flexible printed circuit and may be electrically connected with the data driving circuit 120 and the gate driving circuit 130 through the printed circuit board or the flexible printed circuit.

The controller 140 may transmit/receive signals to/from the data driving circuit 120 according to one or more predetermined interfaces. The interface may include, e.g., a low voltage differential signaling (LVDS) interface, an EPI interface, and a serial peripheral interface (SPI).

The controller 140 may include a storage medium, such as one or more registers.

The display device 100 according to embodiments of the disclosure may be a display including a backlight unit, such as a liquid crystal display, or may be a self-emission display, such as an organic light emitting diode (OLED) display, a quantum dot display, or a micro light emitting diode (LED) display.

If the display device 100 according to embodiments of the disclosure is an OLED display, each subpixel SP may include an organic light emitting diode (OLED), which by itself emits light, as the light emitting element. If the display device 100 according to embodiments of the disclosure is a quantum dot display, each subpixel SP may include a light emitting element formed of a quantum dot, which is a self-luminous semiconductor crystal. If the display device 100 according to embodiments of the disclosure is a micro LED display, each subpixel SP may include a micro LED, which is self-emissive and formed of an inorganic material, as the light emitting element.

Figure 2A:
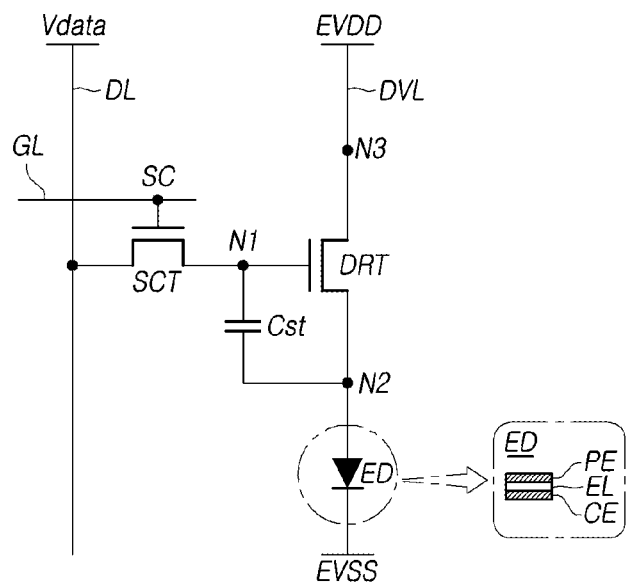
FIGS. 2A and 2B are equivalent circuit diagrams illustrating a subpixel of a display device according to embodiments of the disclosure.
Figure 2B:
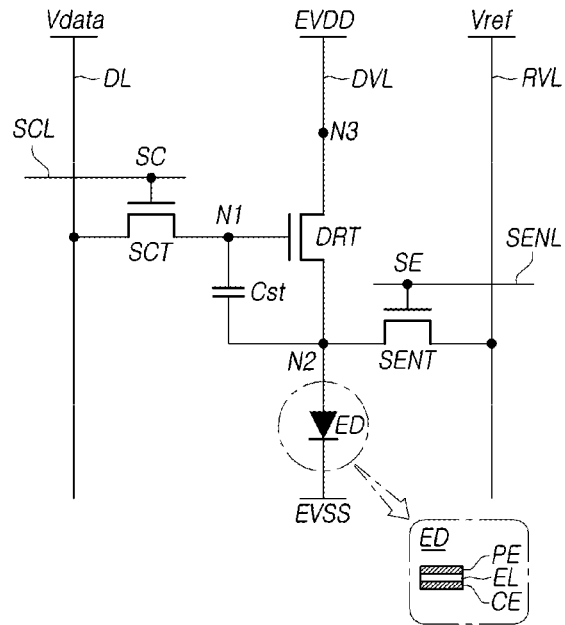

FIGS. 2A and 2B are equivalent circuit diagrams illustrating a subpixel SP of a display device 100 according to embodiments of the disclosure.

Referring to FIG. 2A, each of a plurality of subpixels SP disposed on a display panel 110 of a display device 100 according to embodiments of the disclosure may include a light emitting element ED, a driving transistor DRT, a scan transistor SCT, and a storage capacitor Cst.

Referring to FIG. 2A, the light emitting element ED may include a pixel electrode PE and a common electrode CE and may include a light emitting layer EL positioned between the pixel electrode PE and the common electrode CE.

The pixel electrode PE of the light emitting element ED may be an electrode disposed in each subpixel SP, and the common electrode CE may be an electrode commonly disposed in all the subpixels SP. Here, the pixel electrode PE may be an anode electrode, and the common electrode CE may be a cathode electrode. Or conversely, the pixel electrode PE may be a cathode electrode, and the common electrode CE may be an anode electrode.

For example, the light emitting element ED may be an organic light emitting diode (OLED), a light emitting diode (LED), or a quantum dot light emitting element.

The driving transistor DRT is a transistor for driving the light emitting element ED, and may include a first node N1, a second node N2, and a third node N3.

The first node N1 of the driving transistor DRT may be a gate node of the driving transistor DRT, and may be electrically connected with a source node or a drain node of the scan transistor SCT. The second node N2 of the driving transistor DRT may be a source node or a drain node of the driving transistor DRT, and may be electrically connected the pixel electrode PE of the light emitting element ED. The third node N3 of the driving transistor DRT may be electrically connected with a driving voltage line DVL supplying a driving voltage EVDD.

The scan transistor SCT may be controlled by a scan signal SC, which is a type of gate signal, and may be connected between the first node N1 of the driving transistor DRT and the data line DL. In other words, the scan transistor SCT may be turned on or off according to the scan signal SC supplied from the scan signal line SCL, which is a type of the gate line GL, controlling the connection between the data line DL and the first node N1 of the driving transistor DRT.

The scan transistor SCT may be turned on by the scan signal SC having a turn-on level voltage and transfer the data voltage Vdata supplied from the data line DL to the first node N1 of the driving transistor DRT.

If the scan transistor SCT is an n-type transistor, the turn-on level voltage of the scan signal SC may be a high level voltage. If the scan transistor SCT is a p-type transistor, the turn-on level voltage of the scan signal SC may be a low level voltage.

The storage capacitor Cst may be electrically connected between the first node N1 and second node N2 of the driving transistor DRT. The storage capacitor Cst is charged with the quantity of electric charge corresponding to the voltage difference between both ends thereof and serves to maintain the voltage difference between both ends for a predetermined frame time. Accordingly, during the predetermined frame time, the corresponding subpixel SP may emit light.

Referring to FIG. 2B, each of the plurality of subpixels SP disposed on the display panel 110 of the display device 100 according to embodiments of the disclosure may further include a sensing transistor SENT.

The sensing transistor SENT may be controlled by a sense signal SE, which is a type of gate signal, and may be connected between the second node N2 of the driving transistor DRT and the reference voltage line RVL. In other words, the sensing transistor SENT may be turned on or off according to the sense signal SE supplied from the sense signal line SENL, which is another type of the gate line GL, controlling the connection between the reference voltage line RVL and the second node N2 of the driving transistor DRT.

The sensing transistor SENT may be turned on by the sense signal SE having a turn-on level voltage and transfer a reference voltage Vref supplied from the reference voltage line RVL to the second node N2 of the driving transistor DRT.

The sensing transistor SENT may be turned on by the sense signal SE having a turn-on level voltage, transferring the voltage of the second node N2 of the driving transistor DRT to the reference voltage line RVL.

If the sensing transistor SENT is an n-type transistor, the turn-on level voltage of the sense signal SE may be a high level voltage. If the sensing transistor SENT is a p-type transistor, the turn-on level voltage of the sense signal SE may be a low level voltage.

The function in which the sensing transistor SENT transfers the voltage of the second node N2 of the driving transistor DRT to the reference voltage line RVL may be used upon driving to sense the characteristic value of the subpixel SP. In this case, the voltage transferred to the reference voltage line RVL may be a voltage for calculating the characteristic value of the subpixel SP or a voltage reflecting the characteristic value of the subpixel SP.

In the disclosure, the characteristic value of the subpixel SP may be a characteristic value of the driving transistor DRT or the light emitting element ED. The characteristic value of the driving transistor DRT may include a threshold voltage and mobility of the driving transistor DRT. The characteristic value of the light emitting element ED may include a threshold voltage of the light emitting element ED.

Each of the driving transistor DRT, the scan transistor SCT, and the sensing transistor SENT may be an n-type transistor or a p-type transistor. In the disclosure, for convenience of description, each of the driving transistor DRT, the scan transistor SCT, and the sensing transistor SENT is an n-type transistor.

The storage capacitor Cst is not a parasitic capacitor (e.g., Cgs or Cgd) which is an internal capacitor existing between the gate node and the source node (or drain node) of the driving transistor DRT, but may be an external capacitor intentionally designed outside the driving transistor DRT.

The scan signal line SCL and the sense signal line SENL may be different gate lines GL. In this case, the scan signal SC and the sense signal SE may be separate gate signals, and the on-off timings of the scan transistor SCT and the on-off timings of the sensing transistor SENT in one subpixel SP may be independent. In other words, the on-off timings of the scan transistor SCT and the on-off timings of the sensing transistor SENT in one subpixel SP may be the same or different.

Alternatively and additionally, the scan signal line SCL and the sense signal line SENL may be the same gate line GL. In other words, the gate node of the scan transistor SCT and the gate node of the sensing transistor SENT in one subpixel SP may be connected with one gate line GL. In this case, the scan signal SC and the sense signal SE may be the same gate signals, and the on-off timings of the scan transistor SCT and the on-off timings of the sensing transistor SENT in one subpixel SP may be the same.

The structures of the subpixel SP shown in FIGS. 2A and 2B are merely examples, and various changes may be made thereto, e.g., such as including one or more transistors or one or more capacitors.

Although the subpixel structure is described in connection with FIGS. 2A and 2B under the assumption that the display device 100 is a self-emission display device, if the display device 100 is a liquid crystal display, each subpixel SP may include a transistor and a pixel electrode.

Figure 3:
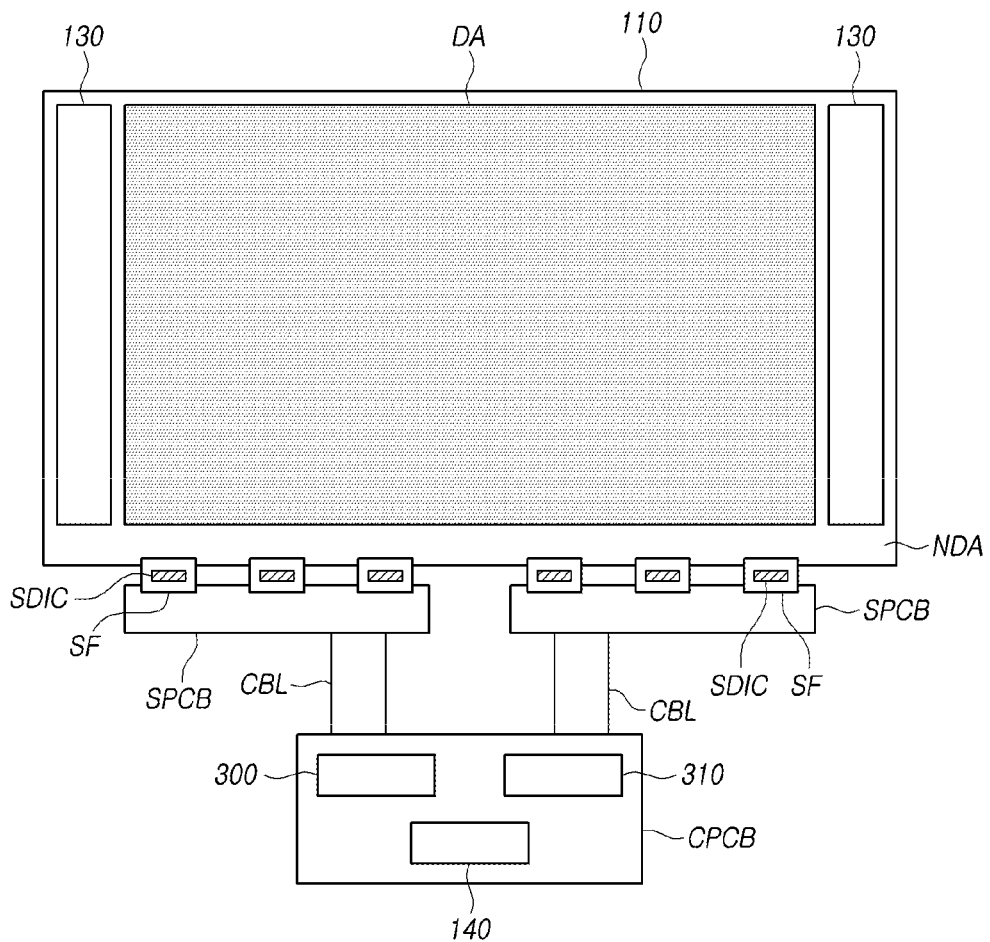
FIG. 3 is a view illustrating a system of a display device according to embodiments of the disclosure.

FIG. 3 is a view illustrating a system of a display device 100 according to embodiments of the disclosure.

Referring to FIG. 3, the display panel 110 may include a display area DA in which images are displayed and a non-display area NDA in which no image is displayed.

Referring to FIG. 3, when a data driving circuit 120 includes one or more source driver integrated circuits SDIC and is implemented in a chip-on-film (COF) type, each source driver integrated circuit SDIC may be mounted on a circuit film SF connected to the non-display area NDA of the display panel 110.

Referring to FIG. 3, a gate driving circuit 130 may be implemented in a gate in panel (GIP) type. In this case, the gate driving circuit 130 may be formed in the non-display area NDA of the display panel 110. Unlike FIG. 3, the gate driving circuit 130 may be implemented in a chip on film (COF) type.

The display device 100 may include at least one source printed circuit board SPCB for circuit connection between one or more source driver integrated circuits SDIC and other devices and a control printed circuit board CPCB for mounting control components and various electric devices.

The source driver integrated circuit SDIC-packed film SF may be connected to at least one source printed circuit board SPCB. In other words, one side of the source driver integrated circuit SDIC-packed film SF may be electrically connected with the display panel 110, and the opposite side thereof may be electrically connected with the source printed circuit board SPCB.

A controller 140 and a power management integrated circuit (PMIC) 310 may be mounted on the control printed circuit board CPCB. The controller 140 may perform overall control functions related to driving of the display panel 110, and may control operations of the data driving circuit 120 and the gate driving circuit 130. The power management integrated circuit 310 may supply various voltages or currents to the data driving circuit 120 and the gate driving circuit 130 or may control various voltages or currents to be supplied thereto.

At least one source printed circuit board SPCB and the control printed circuit board CPCB may be circuit-connected through at least one connection cable CBL. Here, the connection cable CBL may be, e.g., a flexible printed circuit (FPC) or a flexible flat cable (FFC).

At least one source printed circuit board SPCB and control printed circuit board CPCB may be integrated into one printed circuit board.

The display device 100 according to embodiments of the disclosure may further include a level shifter 300 for adjusting a voltage level. For example, the level shifter 300 may be disposed on a control printed circuit board CPCB or a source printed circuit board SPCB.

In particular, in the display device 100 according to embodiments of the disclosure, the level shifter 300 may supply signals necessary for gate driving to the gate driving circuit 130. For example, the level shifter 300 may supply a plurality of clock signals to the gate driving circuit 130. Accordingly, the gate driving circuit 130 may output the plurality of gate signals to the plurality of gate lines GL based on the plurality of clock signals input from the level shifter 300. The plurality of gate lines GL may transfer the plurality of gate signals to the subpixels SP disposed in the display area DA of the substrate SUB.

Figure 4:
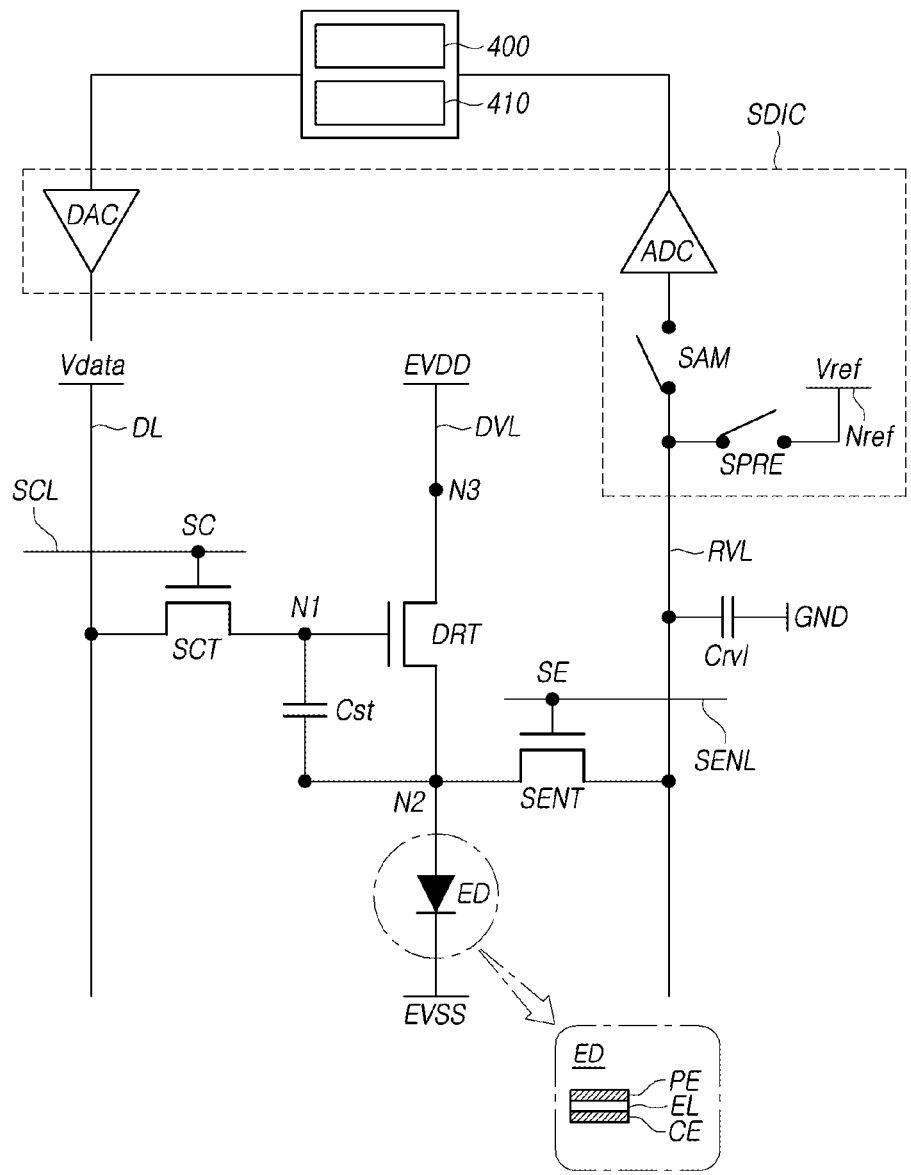
FIG. 4 is a view illustrating a compensation circuit of a display device according to embodiments of the disclosure.

FIG. 4 is a view illustrating a compensation circuit of a display device 100 according to embodiments of the disclosure.

Referring to FIG. 4, the compensation circuit is a circuit capable of sensing and compensation processing on characteristic values of circuit elements in the subpixel SP.

The compensation circuit may be connected to the subpixel SP and may include a power switch SPRE, a sampling switch SAM, an analog-to-digital converter ADC, and a compensator 400.

The power switch SPRE may control the connection between the reference voltage line RVL and the reference voltage supply node Nref. The reference voltage Vref output from the power supply may be supplied to the reference voltage supply node Nref, and the reference voltage Vref supplied to the reference voltage supply node Nref may be applied to the reference voltage line RVL through the power switch SPRE.

The sampling switch SAM may control a connection between the analog-to-digital converter ADC and the reference voltage line RVL. If connected to the reference voltage line RVL by the sampling switch SAM, the analog-to-digital converter ADC may convert the voltage (analog voltage) of the connected reference voltage line RVL into a sensing value corresponding to a digital value.

A line capacitor Crvl may be formed between the reference voltage line RLV and the ground GND. The voltage of the reference voltage line RVL may correspond to the charge amount of the line capacitor Crvl.

The analog-to-digital converter ADC may provide sensing data including a sensing value to the compensator 400.

The compensator 400 may find out the characteristic value of the light emitting element ED or the driving transistor DRT included in the corresponding subpixel SP based on the sensing data, calculate a compensation value, and store it in the memory 410.

For example, the compensation value is information for reducing a deviation in characteristic value between the light emitting elements ED or a deviation in characteristic value between the driving transistors DRT and may include an offset and a gain value for data change.

The display controller 140 may change the image data using the compensation value stored in the memory 410 and may supply the changed image data to the data driving circuit 120.

The data driving circuit 120 may convert the changed image data into a data voltage Vdata corresponding to the analog voltage using the digital-to-analog converter DAC and output the data voltage Vdata. Accordingly, compensation may be realized.

Referring to FIG. 4, the analog-to-digital converter ADC, the power switch SPRE, and the sampling switch SAM may be included in the source driver integrated circuit SDIC included in the data driving circuit 120. The compensator 400 may be included in the display controller 140.

As described herein, the display device 100 according to embodiments of the disclosure may perform compensation processing to reduce a deviation in characteristic value between the driving transistors DRT. To perform compensation processing, the display device 100 may perform sensing driving to detect the deviation in characteristic value between the driving transistors DRT.

The display device 100 according to embodiments of the disclosure may perform sensing driving in two modes (fast mode and slow mode). Sensing driving in the two modes (fast mode and slow mode) is described herein with reference to FIGS. 5A and 5B.

Figure 5A:
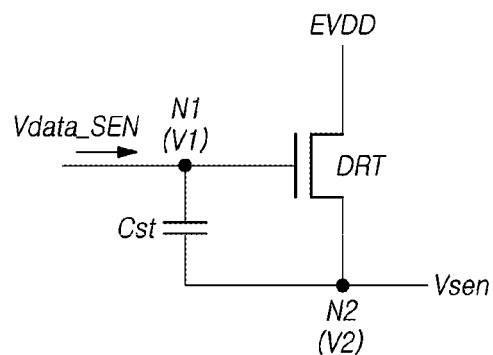
FIG. 5A is a diagram illustrating a first sensing mode of a display device according to embodiments of the disclosure.
Figure 5A:
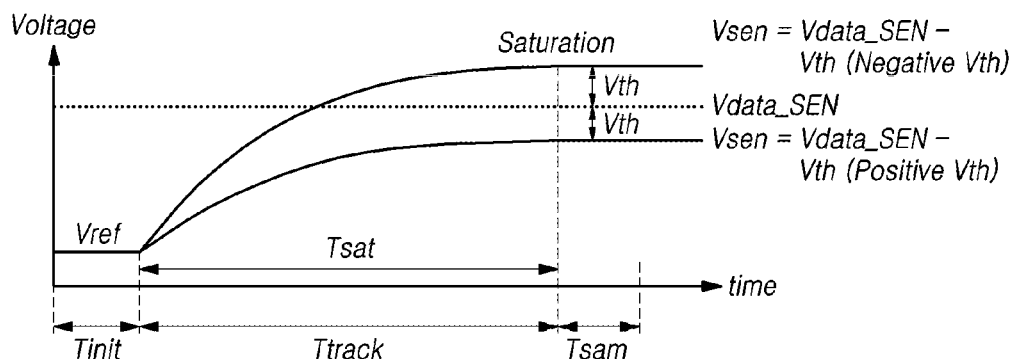
Figure 5B:
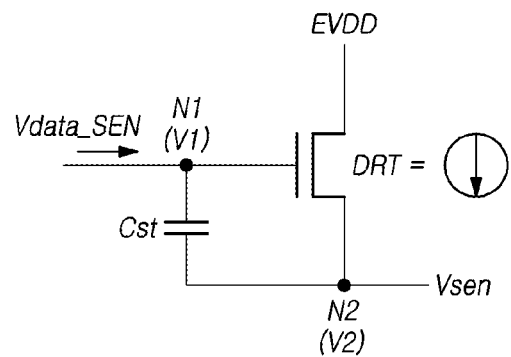
FIG. 5B is a diagram illustrating a second sensing mode of a display device according to embodiments of the disclosure.
Figure 5B:
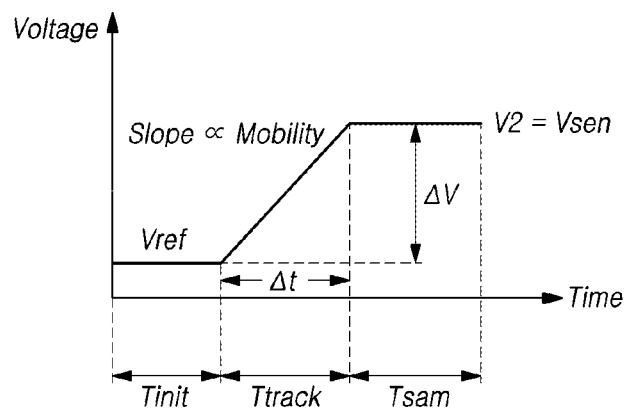

FIG. 5A is a diagram illustrating a first sensing mode S-Mode of a display device 100 according to embodiments of the disclosure. FIG. 5B is a diagram illustrating a second sensing mode F-Mode of a display device 100 according to embodiments of the disclosure.

Referring to FIG. 5A, the first sensing mode S-Mode is a sensing driving mode for slowly sensing the characteristic value (e.g., threshold voltage) requiring a relatively long driving time among the characteristic values (e.g., threshold voltage and mobility) of the driving transistor DRT. The first sensing mode S-Mode may also be referred to as a slow mode or a threshold voltage sensing mode.

Referring to FIG. 5B, the second sensing mode F-Mode is a sensing driving mode for quickly sensing the characteristic value (e.g., mobility) requiring a relatively short driving time among the characteristic values (e.g., threshold voltage and mobility) of the driving transistor DRT. The second sensing mode F-Mode may also be referred to as a fast mode or a mobility sensing mode.

Referring to FIGS. 5A and 5B, the sensing driving period of the first sensing mode S-Mode and the sensing driving period of the second sensing mode F-Mode, each, may include an initialization period Tinit, a tracking period Ttrack, and a sampling period Tsam. The first sensing mode S-Mode and the second sensing mode F-Mode each are described below.

The sensing driving period of the first sensing mode S-Mode of the display device 100 is described herein with reference to FIG. 5A.

Referring to FIG. 5A, the initialization period Tinit of the sensing driving period of the first sensing mode S-Mode is a period for initializing the first node N1 and the second node N2 of the driving transistor DRT.

During the initialization period Tinit, the voltage V1 of the first node N1 of the driving transistor DRT may be initialized as a sensing driving data voltage Vdata_SEN, and the voltage V2 of the second node N2 of the driving transistor DRT may be initialized as a sensing driving reference voltage Vref.

During the initialization period Tinit, the scan transistor SCT and the sensing transistor SENT may be turned on, and the power switch SPRE may be turned on.

Referring to FIG. 5A, the tracking period Ttrack of the sensing driving period of the first sensing mode S-Mode is a period for tracking the voltage V2 of the second node N2 of the driving transistor DRT reflecting the threshold voltage Vth of the driving transistor DRT or a change therein.

During the tracking period Ttrack, the power switch SPRE may be turned off, or the sensing transistor SENT may be turned off.

Accordingly, during the tracking period Ttrack, the first node N1 of the driving transistor DRT is in a constant voltage state of having the sensing driving data voltage Vdata_SEN, but the second node N2 of the driving transistor DRT may be in an electrically floating state. Accordingly, during the tracking period Ttrack, the voltage V2 of the second node N2 of the driving transistor DRT may be varied.

During the tracking period Ttrack, the voltage V2 of the second node N2 of the driving transistor DRT may increase until the voltage V2 of the second node N2 of the driving transistor DRT reflects the threshold voltage Vth of the driving transistor DRT.

During the initialization period Tinit, the voltage difference between the first node N1 and second node N2 of the initialized driving transistor DRT may be the threshold voltage Vth of the driving transistor DRT or more. Accordingly, when the tracking period Ttrack starts, the driving transistor DRT is in a turn-on state and conducts current. Accordingly, if the tracking period Ttrack starts, the voltage V2 of the second node N2 of the driving transistor DRT may increase.

During the tracking period Ttrack, the voltage V2 of the second node N2 of the driving transistor DRT does not steadily increase.

To the end of the tracking period Ttrack, the width at which the voltage of the second node N2 of the driving transistor DRT increase may be reduced and, resultantly, the voltage V2 of the second node N2 of the driving transistor DRT may be saturated.

The saturated voltage V2 of the second node N2 of the driving transistor DRT may correspond to the difference Vdata_SEN-Vth between the data voltage Vdata_SEN and the threshold voltage Vth or the difference Vdata_SEN-ΔVth between the data voltage Vdata_SEN and the threshold voltage deviation ΔVth. Here, the threshold voltage Vth may be a negative threshold voltage (Negative Vth) or a positive threshold voltage (Positive Vth).

If the voltage V2 of the second node N2 of the driving transistor DRT is saturated, the sampling period Tsam may be started.

Referring to FIG. 5A, the sampling period Tsam of the sensing driving period of the first sensing mode S-Mode is a period for measuring the voltage (Vdata_SEN-Vth, Vdata_SEN-ΔVth) reflecting the threshold voltage Vth of the driving transistor DRT or a change therein.

The sampling period Tsam of the sensing driving period of the first sensing mode S-Mode is a step in which the analog-to-digital converter ADC senses the voltage of the reference voltage line RVL. The voltage of the reference voltage line RVL may correspond to the voltage V2 of the second node N2 of the driving transistor DRT and correspond to the charged voltage of the line capacitor Crvl formed in the reference voltage line RVL.

During the sampling period Tsam, the voltage Vsen sensed by the analog-to-digital converter ADC is the voltage Vdata_SEN-Vth which is the data voltage Vdata_SEN minus the threshold voltage Vth or the voltage Vdata_SEN-ΔVth which is the data voltage Vdata_SEN minus the threshold voltage deviation ΔVth. Here, Vth may be a positive threshold voltage or a negative threshold voltage.

Referring to FIG. 5A, during the tracking period Ttrack of the sensing driving period of the first sensing mode S-Mode, the saturation time Tsat taken for the voltage V2 of the second node N2 of the driving transistor DRT to be increased and saturated may be a temporal length of the tracking period Ttrack of the sensing driving period of the first sensing mode S-Mode and may be a time taken for the threshold voltage Vth of the driving transistor DRT or a change therein to be reflected to the voltage V2 (V2=Vdata_SEN-Vth) of the second node N2 of the driving transistor DRT.

The saturation time Tsat may occupy most of the overall temporal length of the sensing driving period of the first sensing mode S-Mode. In the first sensing mode S-Mode, it may take a quite long time (saturation time: Tsat) for the voltage V2 of the second node N2 of the driving transistor DRT to be increased and saturated.

As described herein, the sensing driving scheme for sensing the threshold voltage of the driving transistor DRT requires a long saturation time Tsat until the voltage state of the second node N2 of the driving transistor DRT indicates the threshold voltage of the driving transistor DRT and is thus referred to as a slow mode (first sensing mode S-Mode).

The sensing driving period of the second sensing mode F-Mode of the display device 100 is described with reference to FIG. 5B.

Referring to FIG. 5B, the initialization period Tinit of the sensing driving period of the second sensing mode F-Mode is a period for initializing the first node N1 and the second node N2 of the driving transistor DRT.

During the initialization period Tinit, the scan transistor SCT and the sensing transistor SENT may be turned on, and the power switch SPRE may be turned on.

During the initialization period Tinit, the voltage V1 of the first node N1 of the driving transistor DRT may be initialized as a sensing driving data voltage Vdata_SEN, and the voltage V2 of the second node N2 of the driving transistor DRT may be initialized as a sensing driving reference voltage Vref.

Referring to FIG. 5B, the tracking period Ttrack of the sensing driving period of the second sensing mode F-Mode is a period during which the voltage V2 of the second node N2 of the driving transistor DRT is changed during a preset tracking time Δt until the voltage V2 of the second node N2 of the driving transistor DRT becomes a voltage state of reflecting the mobility of the driving transistor DRT or a change in mobility.

During the tracking period Ttrack, the preset tracking time Δt may be set to be short. Accordingly, during the short tracking time Δt, it is hard for the voltage V2 of the second node N2 of the driving transistor DRT to reflect the threshold voltage Vth. However, during the short tracking time Δt, the voltage V2 of the second node N2 of the driving transistor DRT may be changed in such an extent as to be able to figure out the mobility of the driving transistor DRT.

Accordingly, the second sensing mode F-Mode is a sensing driving scheme for sensing the mobility of the driving transistor DRT.

In the tracking period Ttrack, as the power switch SPRE is turned off or the sensing transistor SENT is turned off, the second node N2 of the driving transistor DRT may become an electrically floating state.

During the tracking period Ttrack, by the scan signal SC of the turn-off level voltage, the scan transistor SCT may be in a turned-off state, and the first node N1 of the driving transistor DRT may be in a floating state.

During the initialization period Tinit, the voltage difference between the first node N1 and second node N2 of the initialized driving transistor DRT may be the threshold voltage Vth of the driving transistor DRT or more. Accordingly, when the tracking period Ttrack starts, the driving transistor DRT is in a turn-on state and conducts current.

If the first node N1 and second node N2 of the driving transistor DRT are the gate node and source node, respectively, the voltage difference between the first node N1 and second node N2 of the driving transistor DRT becomes Vgs.

Accordingly, during the tracking period Ttrack, the voltage V2 of the second node N2 of the driving transistor DRT may be increased. In this case, the voltage V1 of the first node N1 of the driving transistor DRT may also be increased.

During the tracking period Ttrack, the increasing rate of the voltage V2 of the second node N2 of the driving transistor DRT is varied depending on the current capability (i.e., mobility) of the driving transistor DRT. As the current capability (mobility) of the driving transistor DRT increases, the voltage V2 of the second node N2 of the driving transistor DRT may be further sharply increased.

After the tracking period Ttrack proceeds the preset tracking time Δt, i.e., after the voltage V2 of the second node N2 of the driving transistor DRT rises during the preset tracking time Δt, the sampling period Tsam may proceed.

During the tracking period Ttrack, the increasing rate of the voltage V2 of the second node N2 of the driving transistor DRT corresponds to the voltage variation ΔV of the second node N2 of the driving transistor DRT during the preset tracking time Δt. The voltage variation ΔV of the second node N2 of the driving transistor DRT may correspond to the voltage variation of the reference voltage line RVL.

Referring to FIG. 5B, after the tracking period Ttrack proceeds the preset tracking time Δt, the sampling period Tsam may begin. During the sampling period Tsam, the sampling switch SAM may be turned on, so that the reference voltage line RVL and the analog-to-digital converter ADC may be electrically connected with each other.

The analog-to-digital converter ADC may sense the voltage of the reference voltage line RVL. The voltage Vsen sensed by the analog-to-digital converter ADC may be the voltage Vref+ΔV which is the reference voltage Vref plus an increment during the preset tracking time Δt, i.e., the voltage variation Δt.

The voltage Vsen sensed by the analog-to-digital converter ADC may be the voltage of the reference voltage line RVL and may be the voltage of the second node N2 electrically connected with the reference voltage line RVL through the sensing transistor SENT.

Referring to FIG. 5B, in the sampling period Tsam of the sensing driving period of the second sensing mode F-Mode, the voltage Vsen sensed by the analog-to-digital converter ADC may be varied depending on the mobility of the driving transistor DRT. As the mobility of the driving transistor DRT increases, the sensing voltage Vsen increases. As the mobility of the driving transistor DRT decreases, the sensing voltage Vsen decreases.

As described above, the sensing driving scheme for sensing the mobility of the driving transistor DRT may change the voltage of the second node N2 of the driving transistor DRT only for a short time Δt and is thus called a fast mode (second sensing mode F-Mode).

Referring to FIG. 5A, the display device 100 according to embodiments of the disclosure may figure out the threshold voltage Vth of the driving transistor DRT, or a change therein, in the corresponding subpixel SP based on the voltage Vsen sensed through the first sensing mode S-Mode, calculate the threshold voltage compensation value of reducing or removing the threshold voltage deviation between the driving transistors DRT, and store the calculated threshold voltage compensation value in the memory 410.

Referring to FIG. 5B, the display device 100 according to embodiments of the disclosure may figure out the mobility of the driving transistor DRT, or a change therein, in the corresponding subpixel SP based on the voltage Vsen sensed through the second sensing mode F-Mode, calculate the mobility compensation value of reducing or removing the mobility deviation between the driving transistors DRT, and store the calculated mobility compensation value in the memory 410.

When supplying the data voltage Vdata for display driving to the corresponding subpixel SP, the display device 100 may supply the data voltage Vdata changed based on the threshold voltage compensation value and the mobility compensation value.

According to the foregoing description, the threshold voltage sensing, by the nature of requiring a long sensing time, may proceed in the first sensing mode S-Mode, and the mobility sensing, by the nature that a short sensing time suffices, may proceed in the second sensing mode F-Mode.

Figure 6:
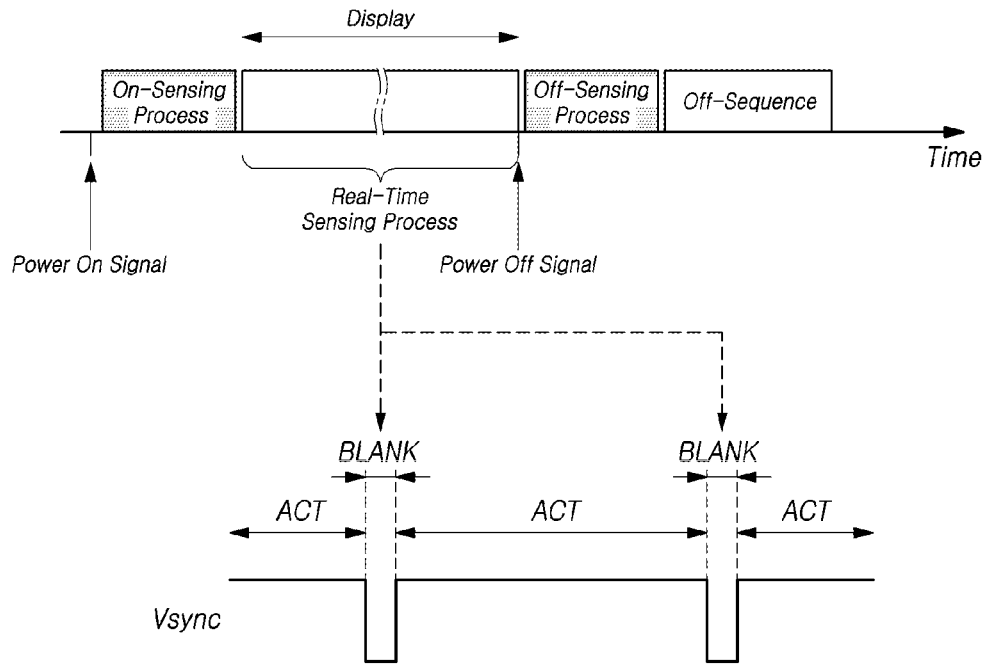
FIG. 6 is a view illustrating various sensing timings of a display device according to embodiments of the disclosure.

FIG. 6 is a view illustrating various sensing timings of a display device 100 according to embodiments of the disclosure.

Referring to FIG. 6, the display device 100 according to embodiments of the disclosure may sense the characteristic value of the driving transistor DRT in each subpixel SP disposed in the display panel 110 if a power on signal is generated. Such sensing process is referred to as an "on-sensing process."

Referring to FIG. 6, the display device 100 according to embodiments of the disclosure may sense the characteristic value of the driving transistor DRT in each subpixel SP disposed in the display panel 110 before an off sequence, such as power off, proceeds if a power off signal is generated. Such sensing process is referred to as an "off-sensing process."

Referring to FIG. 6, the display device 100 according to embodiments of the disclosure may sense the characteristic value of the driving transistor DRT in each subpixel SP during display driving until before a power off signal is generated after a power on signal is generated. Such sensing process is referred to as a "real-time sensing process."

Such real-time sensing process may be performed every blank time BLANK between the active times ACT with respect to the vertical sync signal Vsync.

Since the mobility sensing of the driving transistor DRT requires only a short time, the mobility sensing may proceed in the second sensing mode F-Mode among sensing driving schemes.

The mobility sensing that may proceed in the second sensing mode F-Mode which is the fast mode requires only a short time, so that mobility sensing may proceed in any one of the on-sensing process, off-sensing process, and real-time sensing process.

For example, the mobility sensing which may proceed in the second sensing mode F-Mode which is the fast mode may proceed in the real-time sensing process that may reflect changes in mobility in real-time during display driving. In other words, the mobility sensing may proceed every blank period during display driving.

In contrast, the threshold voltage sensing of the driving transistor DRT requires a long saturation time Tsat. Accordingly, the threshold voltage sensing may proceed in the first sensing mode S-Mode among the sensing driving schemes.

The threshold voltage sensing should be performed using a timing when the user's viewing is not disturbed. Accordingly, the threshold voltage sensing of the driving transistor DRT may proceed while display driving is not done (i.e., the circumstance where the user does not intend to view) after a power off signal is generated according to, e.g., a user input. In other words, the threshold voltage sensing may proceed in the off-sensing process.

Figure 7:
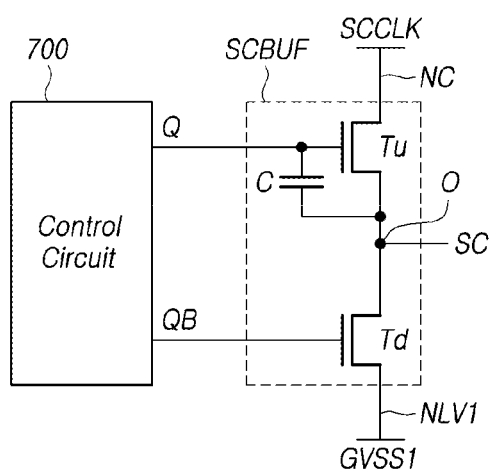
FIG. 7 is a diagram schematically illustrating a gate driving circuit of a display device according to embodiments of the disclosure.

FIG. 7 is a diagram schematically illustrating a gate driving circuit 130 of a display device 100 according to embodiments of the disclosure.

Referring to FIG. 7, the gate driving circuit 130 according to embodiments of the disclosure may include a plurality of scan driving circuits SCDR, and the plurality of scan driving circuits SCDR may correspond to a plurality of scan lines SCL.

Referring to FIG. 7, each of the plurality of scan driving circuits SCDR may further include a scan output buffer SCBUF for outputting the scan signal SC and a control circuit 700 for controlling the scan output buffer SCBUF.

The scan output buffer SCBUF may receive a scan clock signal SCCLK and a first low-potential voltage GVSS1 and output the scan signal SC to a scan output node O.

The scan output buffer SCBUF may include a pull-up transistor Tu to which the scan clock signal SCCLK is input and a pull-down transistor Td to which the first low-potential voltage GVSS1 is input.

The scan output buffer SCBUF may output the scan signal SC to the scan output node O where the pull-up transistor Tu and the pull-down transistor Td are connected.

The pull-up transistor Tu may switch connection between the scan clock node NC and the scan output node O according to the voltage of the Q node.

The pull-down transistor Td may switch connection between the first low-potential voltage node NLV1 and the scan output node O according to the voltage of the QB node.

In the pull-up transistor Tu, a capacitor C may be electrically connected between the Q node, which is the gate node, and the scan output node O. The capacitor C may serve to boost the voltage of the Q node according to the voltage variation of the scan output node O.

The control circuit 700 may control the voltage of the Q node electrically connected to the gate node of the pull-up transistor Tu and control the voltage of the QB node electrically connected to the gate node of the pull-down transistor Td. The QB node may receive a DC voltage or an AC signal through the transistor.

The control circuit 700 may include a plurality of transistors to control the respective voltages of the Q node and the QB node. For example, the control circuit 700 may include one or more transistors for charging the Q node, one or more transistors for discharging the Q node, one or more transistors for charging the QB node, and one or more transistors for discharging the QB node.

The control circuit 700 may receive a start signal, a reset signal, and the like to control the respective voltages of the Q node and the QB node and may further receive a carry signal according to the gate driving scheme.

Figure 8:
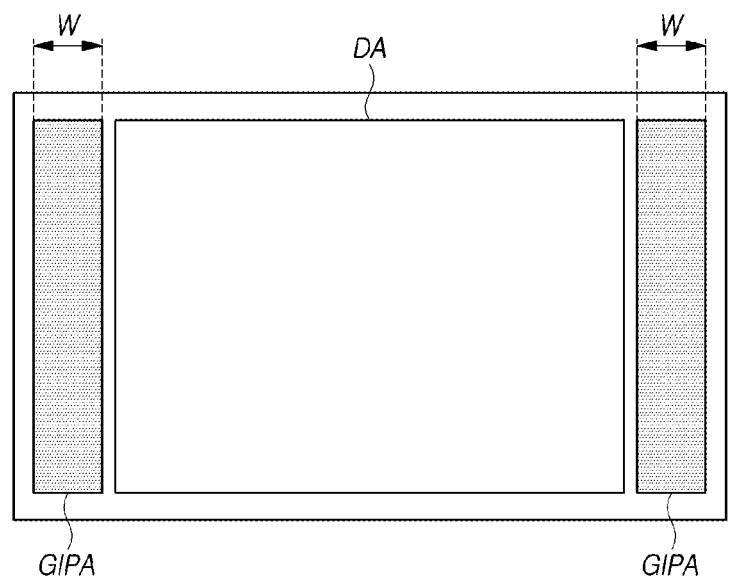
FIG. 8 is a view illustrating a display panel where a gate driving circuit is disposed in a display device according to embodiments of the disclosure.

FIG. 8 illustrates a display panel 110 where a gate driving circuit 130 is disposed in a display device 100 according to embodiments of the disclosure.

Referring to FIG. 8, the gate driving circuit 130 may be a built-in-panel circuit disposed in the non-display area NDA, which is an outer area of the display area DA of the display panel 110. In this case, the gate driving circuit 130 may be disposed in the gate driving circuit area GIPA in the non-display area NDA.

As illustrated in FIG. 8, the gate driving circuit area GIPA may be positioned on two opposite sides of the display area DA. In some cases, the gate driving circuit area GIPA may be positioned on only one side of the display area DA.

Referring to FIG. 8, to reduce the bezel size of the display device 100, it is necessary to reduce the width W of the gate driving circuit area GIPA.

Accordingly, embodiments of the disclosure may provide a gate driving circuit 130 having a low-area structure and a display device 100 including the same. A gate driving circuit 130 having a low-area structure and a display device 100 including the same according to embodiments of the disclosure are described below.

Figure 9:
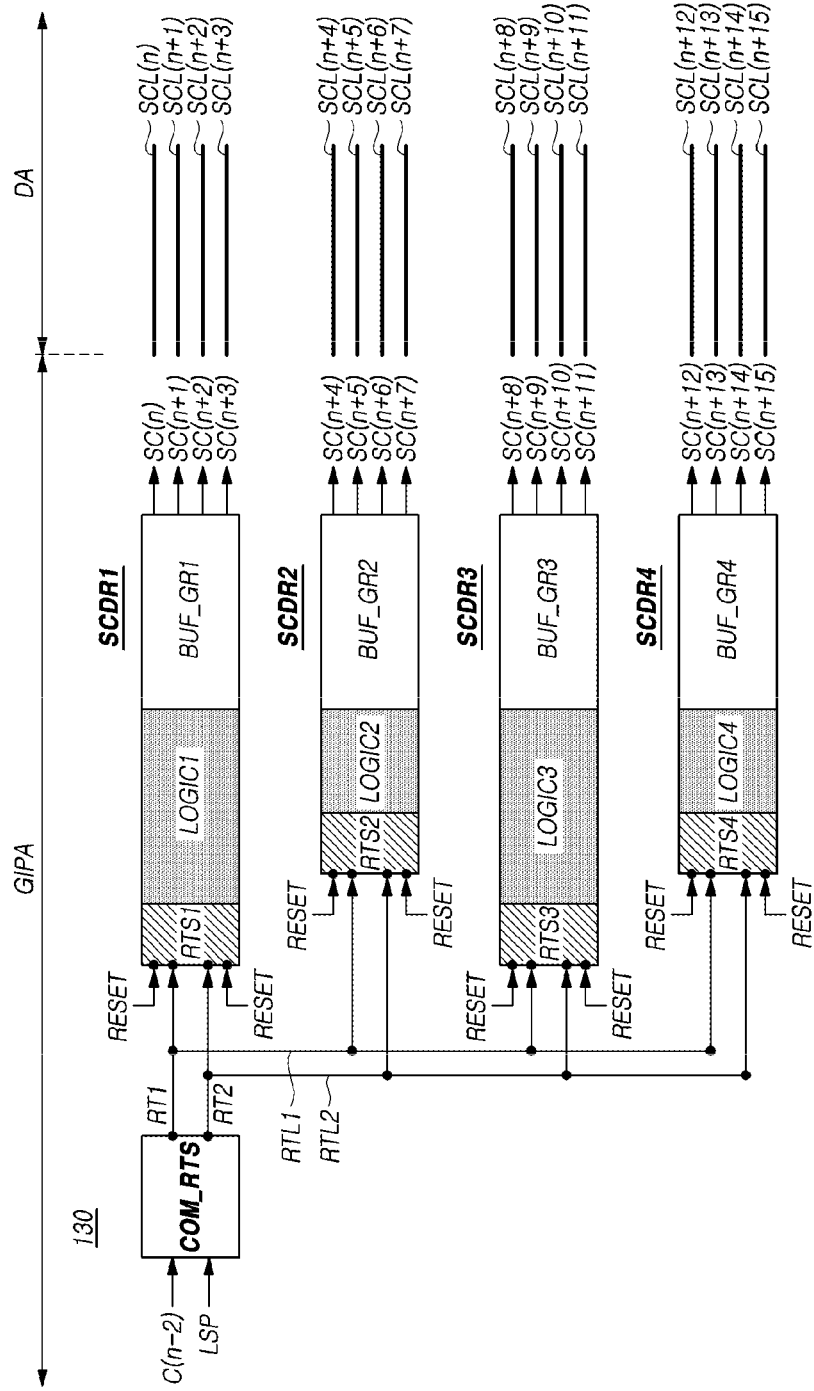
FIGS. 9 and 10 are block diagrams illustrating a gate driving circuit having a low-area structure according to embodiments of the disclosure.
Figure 10:
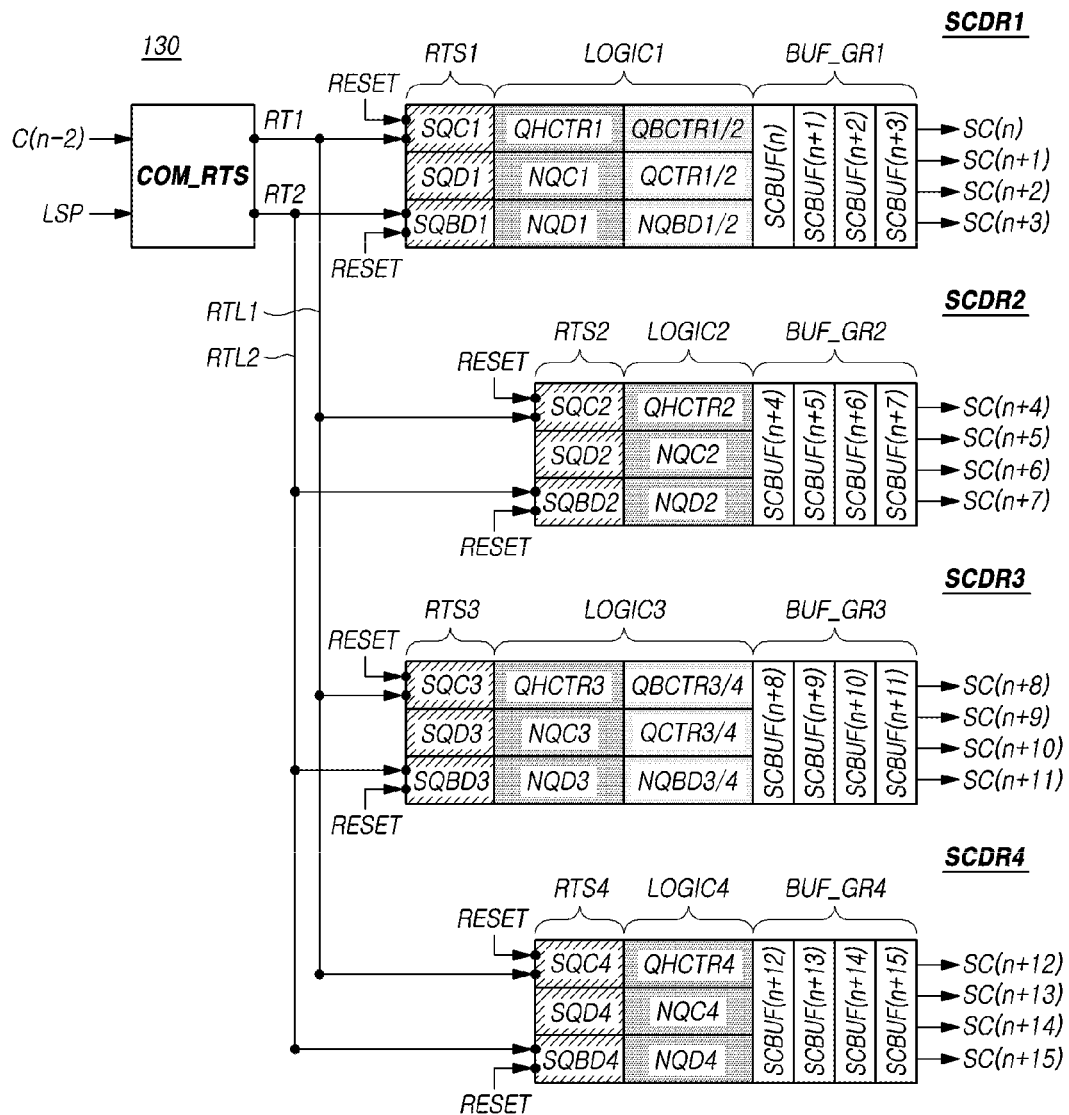

FIGS. 9 and 10 are block diagrams illustrating a gate driving circuit 130 having a low-area structure according to embodiments of the disclosure.

Referring to FIG. 9, the gate driving circuit 130 having a low-area structure according to embodiments of the disclosure is a built-in-panel circuit and may be disposed in the gate driving circuit area GIPA. The gate driving circuit area GIPA may be included in the non-display area NDA outside the display area DA of the display panel 110.

Referring to FIG. 9, the gate driving circuit 130 having a low-area structure according to embodiments of the disclosure may include a first scan driving circuit SCDR1, a second scan driving circuit SCDR2, a third scan driving circuit SCDR3, a fourth scan driving circuit SCDR4, and a common sensing circuit COM_RTS.

The first scan driving circuit SCDR1 may be configured to output an nth to (n+k−1)th scan signal SC(n) to SC(n+3) to an nth to (n+k−1)th scan line SCL(n) to SCL(n+3). Here, n is a natural number of 1 or more. k may be a natural number of 2 or more.

The second scan driving circuit SCDR2 may be configured to output an (n+k)th to (n+2k−1)th scan signal SC(n+4) to SC(n+7) to an (n+k)th to (n+2k−1)th scan line SCL(n+4) to SCL(n+7).

The third scan driving circuit SCDR3 may be configured to output an (n+2k)th to (n+3k−1)th scan signal SC(n+8) to SC(n+11) to an (n+2k)th to (n+3k−1)th scan line SCL(n+8) to SCL(n+11).

The fourth scan driving circuit SCDR4 may be configured to output an (n+3k)th to (n+4k−1)th scan signal SC(n+12) to SC(n+15) to an (n+3k)th to (n+4k−1)th scan line SCL(n+12) to SCL(n+15).

Referring to FIG. 9, the common sensing circuit COM_RTS may be commonly connected to the first scan driving circuit SCDR1, the second scan driving circuit SCDR2, the third scan driving circuit SCDR3, and the fourth scan driving circuit SCDR4 and be configured to receive a line selection signal LSP and output a first common control signal RT1 and a second common control signal RT2 to the first to fourth scan driving circuits SCDR1 to SCDR4.

The common sensing circuit COM_RTS is a circuit necessary in each of the first scan driving circuit SCDR1, the second scan driving circuit SCDR2, the third scan driving circuit SCDR3, and the fourth scan driving circuit SCDR4.

However, in the gate driving circuit 130 according to embodiments of the disclosure, as the common sensing circuit COM_RTS is shared by the first scan driving circuit SCDR1, the second scan driving circuit SCDR2, the third scan driving circuit SCDR3, and the fourth scan driving circuit SCDR4, the area of the gate driving circuit 130 may be significantly reduced.

Referring to FIG. 9, in the gate driving circuit 130 having a low-area structure, during the sensing driving period, one of the first to fourth scan driving circuits SCDR1 to SCDR4 may output a scan signal for sensing driving to a corresponding scan line among 4k scan lines SCL(n) to SCL(n+15) after the reset signal RESET is input.

Here, the sensing driving period may overlap the blank period BLANK. The sensing driving period may be a mobility sensing period during which the fast mode F-MODE may proceed during the blank period BLANK (refer to FIG. 5B).

Meanwhile, the target subpixel SP or the target subpixel row where mobility sensing proceeds may randomly be determined.

k as mentioned herein may be a natural number of 2 or more, e.g., k may be 4 or 6. FIGS. 9 and 10 illustrate an example of the gate driving circuit 130 when k is 4. k as mentioned above may be referred to as a Q node sharing range index and may mean the number of scan output buffers sharing one Q node or one QB node. For example, referring to FIG. 10, when k is 4, the four scan output buffers SCBUF(n) to SCBUF(n+3) included in the first buffer group BUF_GR1 may share one first Q node Q1. In the disclosure, each buffer group is a set of buffers sharing one Q node or one QB node.

Further, the k mentioned herein may mean the number of scan output buffers that share the logic unit or the sensing unit. For example, referring to FIG. 10, when k is 4, four scan output buffers SCBUF(n) to SCBUF(n+3) included in the first buffer group BUF_GR1 may share one first logic unit LOGIC1 or one first sensing unit RTS1.

Referring to FIG. 10, the first scan driving circuit SCDR1 may include a first buffer group BUF_GR1 including the nth to (n+k−1)th scan output buffers SCBUF(n) to SCBUF(n+3) electrically connected to the nth to (n+k−1)th scan lines SCL(n) to SCL(n+3), a first logic unit LOGIC1 for controlling the first buffer group BUF_GR1 during the display driving period, and a first sensing unit RTS1 for controlling the first buffer group BUF_GR1 during the sensing driving period. The first logic unit LOGIC1 and the first sensing unit RTS1 may be considered as included in the control circuit 700 of FIG. 7.

Referring to FIG. 10, the second scan driving circuit SCDR2 may include a second buffer group BUF_GR2 including the (n+k)th to (n+2k−1)th scan output buffers SCBUF(n+4) to SCBUF(n+7) electrically connected to the (n+k)th to (n+2k−1)th scan lines SCL(n+4) to SCL(n+7), a second logic unit LOGIC2 for controlling the second buffer group BUF_GR2 during the display driving period, and a second sensing unit RTS2 for controlling the second buffer group BUF_GR2 during the sensing driving period.

Referring to FIG. 10, the third scan driving circuit SCDR3 may include a third buffer group BUF_GR3 including the (n+2k)th to (n+3k−1)th scan output buffers SCBUF(n+8) to SCBUF(n+11) electrically connected to the (n+2k)th to (n+3k−1)th scan lines SCL(n+8) to SCL(n+11), a third logic unit LOGIC3 for controlling the third buffer group BUF_GR3 during the display driving period, and a third sensing unit RTS3 for controlling the third buffer group BUF_GR3 during the sensing driving period.

Referring to FIG. 10, the fourth scan driving circuit SCDR4 may include a fourth buffer group BUF_GR4 including the (n+3k)th to (n+4k−1)th scan output buffers SCBUF(n+12) to SCBUF(n+15) electrically connected to the (n+3k)th to (n+4k−1)th scan lines SCL(n+12) to SCL(n+15), a fourth logic unit LOGIC4 for controlling the fourth buffer group BUF_GR4 during the display driving period, and a fourth sensing unit RTS4 for controlling the fourth buffer group BUF_GR4 during the sensing driving period.

Referring to FIG. 10, the first sensing unit RTS1 may include a first sensing Q node charging circuit SQC1 for charging the first Q node Q1 during the sensing driving period, a first sensing Q node discharging circuit SQD1 for discharging the first Q node Q1 during the sensing driving period, and a first sensing QB node discharging circuit SQBD1 for discharging the first QB node QB1 during the sensing driving period.

Referring to FIG. 10, the second sensing unit RTS2 may include a second sensing Q node charging circuit SQC2 for charging the second Q node Q2 during the sensing driving period, a second sensing Q node discharging circuit SQD2 for discharging the second Q node Q2 during the sensing driving period, and a second sensing QB node discharging circuit SQBD2 for discharging the second QB node QB2 during the sensing driving period.

Referring to FIG. 10, the third sensing unit RTS3 may include a third sensing Q node charging circuit SQC3 for charging the third Q node Q3 during the sensing driving period, a third sensing Q node discharging circuit SQD3 for discharging the third Q node Q3 during the sensing driving period, and a third sensing QB node discharging circuit SQBD3 for discharging the third QB node QB3 during the sensing driving period.

Referring to FIG. 10, the fourth sensing unit RTS4 may include a fourth sensing Q node charging circuit SQC4 for charging the fourth Q node Q4 during the sensing driving period, a fourth sensing Q node discharging circuit SQD4 for discharging the fourth Q node Q4 during the sensing driving period, and a fourth sensing QB node discharging circuit SQBD4 for discharging the fourth QB node QB4 during the sensing driving period.

Referring to FIGS. 9 and 10, the gate driving circuit 130 may further include a first common control line RTL1 for commonly transferring a first common control signal RT1 from the common sensing circuit COM_RTS to the first to fourth sensing Q node charging circuits SQC1 to SQC4 and a second common control line RTL2 for commonly transferring a second common control signal RT2 from the common sensing circuit COM_RTS to the first to fourth sensing QB node discharging circuits SQBD1 to SQBD4.

Referring to FIGS. 9 and 10, the first logic unit LOGIC1 may include a circuit portion having the same structure as that of the second logic unit LOGIC2 and a circuit portion not included in the second logic unit LOGIC2. The third logic portion LOGIC3 may include a circuit portion having the same structure as the fourth logic portion LOGIC4 and a circuit portion not included in the fourth logic portion LOGIC4.

Referring to FIG. 10, the first logic unit LOGIC1 may include a first individual logic unit QHCTR1, NQC1, and NQD1 and a first common logic unit QBCTR1/2, QCTR1/2, and NQBD1/2.

However, the second logic unit LOGIC2 may include only a second individual logic unit QHCTR2, NQC2, and NQD2 having the same structure as the first individual logic unit QHCTR1, NQC1, and NQD1.

Referring to FIG. 10, the third logic unit LOGIC3 may include a third individual logic unit QHCTR3, NQC3, and NQD3 and a third common logic unit QBCTR3/4, QCTR3/4, and NQBD3/4.

However, the fourth logic unit LOGIC4 may include only a fourth individual logic unit QHCTR4, NQC4, and NQD4 having the same structure as the third individual logic unit QHCTR3, NQC3, and NQD3.

According to the foregoing description, in the gate driving circuit 130, the area of the second logic unit LOGIC2 may be smaller than the area of the first logic unit LOGIC1, and the area of the fourth logic unit LOGIC4 may be smaller than the area of the logic unit LOGIC2. Accordingly, the area of the gate driving circuit 130 may be significantly reduced.

Referring to FIG. 10, the first individual logic unit QHCTR1, NQC1, and NQD1 may include a first QH control circuit QHCTR1 for controlling the voltage level of the first QH node QH1 in the first scan driving circuit SCDR1, a first normal Q node charging circuit NQC1 for charging the first Q node during the display driving period, and a first normal Q node discharging circuit NQD1 for discharging the first Q node during the display driving period.

Referring to FIG. 10, the second individual logic unit QHCTR2, NQC2, and NQD2 may include a second QH control circuit QHCTR2 for controlling the voltage level of the second QH node QH2 in the second scan driving circuit SCDR2, a second normal Q node charging circuit NQC2 for charging the second Q node during the display driving period, and a second normal Q node discharging circuit NQD2 for discharging the second Q node during the display driving period.

Referring to FIG. 10, the third individual logic unit QHCTR3, NQC3, and NQD3 may include a third QH control circuit QHCTR3 for controlling the voltage level of the third QH node QH3 in the third scan driving circuit SCDR3, a third normal Q node charging circuit NQC3 for charging the third Q node during the display driving period, and a third normal Q node discharging circuit NQD3 for discharging the third Q node during the display driving period.

Referring to FIG. 10, the fourth individual logic unit QHCTR4, NQC4, and NQD4 may include a fourth QH control circuit QHCTR4 for controlling the voltage level of the fourth QH node QH4 in the fourth scan driving circuit SCDR4, a fourth normal Q node charging circuit NQC4 for charging the fourth Q node during the display driving period, and a fourth normal Q node discharging circuit NQD4 for discharging the fourth Q node during the display driving period.

Referring to FIG. 10, the first common logic unit QBCTR1/2, QCTR1/2, and NQBD1/2 may include a first normal QB node discharging circuit NQBD1/2 for discharging the first QB node QB1 during the display driving period, a first QB node control circuit QBCTR1/2 for controlling the voltage of the first QB node QB1 or charging the first QB node QB1, and a first Q node control circuit QCTR1/2 for controlling the voltage of the first Q node Q1.

Referring to FIG. 10, the third common logic unit QBCTR3/4, QCTR3/4, and NQBD3/4 may include a third normal QB node discharging circuit NQBD3/4 for discharging the third QB node QB3 during the display driving period, a third QB node control circuit QBCTR3/4 for controlling the voltage of the third QB node QB3 or charging the third QB node QB3, and a third Q node control circuit QCTR3/4 for controlling the voltage of the third Q node Q3.

The display device 100 according to embodiments of the disclosure may perform sensing driving using the gate driving circuit 130 illustrated in FIG. 10. In this regard, a brief description is given herein.

As illustrated in FIGS. 2B and 4, each of the plurality of subpixels SP disposed in the display panel 110 may include a light emitting element ED, a driving transistor DRT for driving the light emitting element ED, a scan transistor SCT to control the connection between the first node of the driving transistor DRT and the data line DL, a sensing transistor SENT to control the connection between the second node N2 of the driving transistor DRT and the reference voltage line RVL, and a storage capacitor between the first node N1 and second node N2 of the driving transistor DRT.

During the sensing driving period, one of the first to fourth scan driving circuits SCDR1 to SCDR4 may output a sensing driving scan signal to a scan line selected from among 4k scan lines SCL(n) to SCL(n+15) (k=4) by a line selection signal LSP. The line selection signal LSP may be applied to the common sensing circuit COM_RTS.

The output sensing driving scan signal may be applied to the gate node of the scan transistor SCT in the target subpixel SP connected to the selected scan line.

The sensing driving period may overlap the blank period BLANK. The sensing driving period may be a mobility sensing period during which the fast mode F-MODE may proceed during the blank period BLANK (refer to FIG. 5B).

If the sensing driving period is the mobility sensing period, a constant voltage-type reference voltage Vref may be applied to the reference voltage line RVL connected with the target subpixel SP during the initialization period Tinit of the initialization period Tinit and the tracking period Ttrack.

During the tracking period Ttrack after the initialization period Tinit, the voltage of the reference voltage line RVL connected with the target subpixel SP may increase (refer to FIG. 5B).

The voltage increasing rate $\Delta V/\Delta t$ of the reference voltage line RVL may vary depending on the mobility of the driving transistor DRT included in the target subpixel SP.

As the mobility of the driving transistor DRT increases, the voltage increasing rate $\Delta V/\Delta t$ of the reference voltage line RVL may increase. In other words, as the mobility of the driving transistor DRT increases, the voltage increment $\Delta V$ of the reference voltage line RVL for a predetermined time $\Delta t$ may increase.

Figure 11:
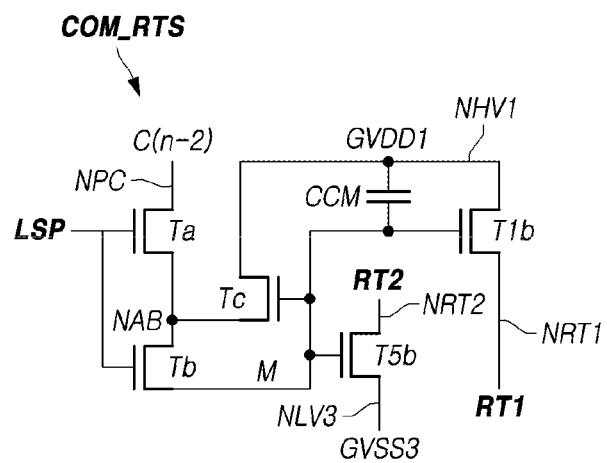
FIG. 11 is a view illustrating a common sensing circuit included in a gate driving circuit having a low-area structure according to embodiments of the disclosure.

FIG. 11 is a view illustrating a common sensing circuit COM_RTS included in a gate driving circuit 130 having a low-area structure according to embodiments of the disclosure.

Referring to FIG. 11, the common sensing circuit COM_RTS may include a first shared control transistor Ta and a second shared control transistor Tb connected in series between a front-end carry input node NPC and a control node M and a third shared control transistor Tc for controlling connection between a first high-potential voltage node NHV1 and the connection node NAB of the first shared control transistor Ta and the second shared control transistor Tb according to the voltage of the control node M.

Referring to FIG. 11, the gate node of the first shared control transistor Ta and the gate node of the second shared control transistor Tb may be commonly connected so that the line selection signal LSP may be commonly applied.

Referring to FIG. 11, the common sensing circuit COM_RTS may further include a fourth shared control transistor T1$b$ for controlling connection between the first high-potential voltage node NHV1 and the first common control node NRT1 according to the voltage of the control node M, a fifth shared control transistor T5$c$ for controlling connection between the third low-potential voltage node NLV3 and the second common control node NRT2 according to the voltage of the control node M, and a shared capacitor CCM between the control node M and the first high-potential voltage node NHV1.

Figure 12:
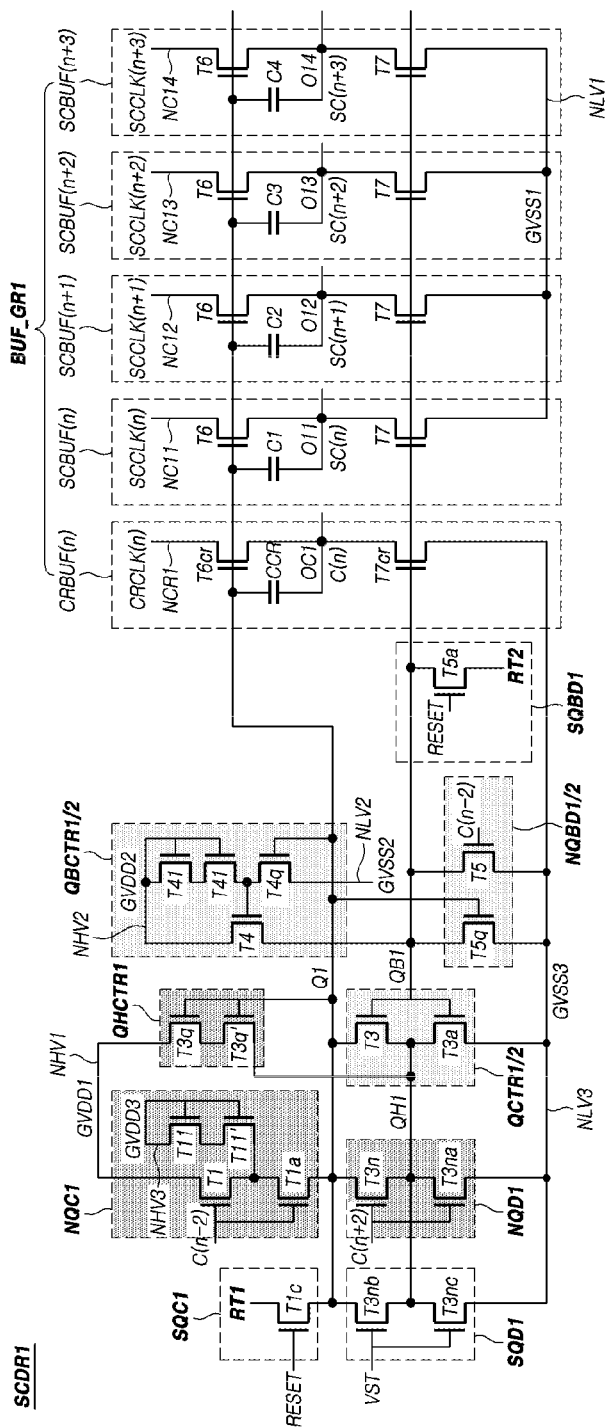
FIG. 12 is a view illustrating a first scan driving circuit included in a gate driving circuit having a low-area structure according to embodiments of the disclosure.

FIG. 12 is a view illustrating a first scan driving circuit SCDR1 included in a gate driving circuit 130 having a low-area structure according to embodiments of the disclosure.

Referring to FIG. 12, the first scan driving circuit SCDR1 may include a first buffer group BUF_GR1 including an nth to (n+k−1)th scan output buffers SCBUF(n) to SCBUF(n+3) electrically connected to an nth to (n+k−1)th scan line SCL(n) to SCL(n+3), a first logic unit LOGIC1 for controlling the first buffer group BUF_GR1 during the display driving period, and a first sensing unit RTS1 for controlling the first buffer group BUF_GR1 during the sensing driving period.

Referring to FIG. 12, each of the nth to (n+k−1)th scan output buffers SCBUF(n) to SCBUF(n+3) included in the first buffer group BUF_GR1 may include a pull-up transistor T6 and a pull-down transistor T7.

The pull-up transistor T6 of the nth scan output buffer SCBUF(n) may control the connection between the nth scan clock node NC11 and the nth scan output node O11. The nth scan clock signal SCCLK(n) may be applied to the nth scan clock node NC11.

An nth capacitor C1 may be formed between the gate node of the pull-up transistor T6 of the nth scan output buffer SCBUF(n) and the nth scan output node O11.

The pull-down transistor T7 of the nth scan output buffer SCBUF(n) may control the connection between the nth scan output node O11 and the first low-potential voltage node NLV1. The first low-potential voltage GVSS1 may be applied to the first low-potential voltage node NLV1.

The pull-up transistor T6 of the n+1th scan output buffer SCBUF(n+1) may control the connection between the n+1th scan clock node NC12 and the n+1th scan output node O12. The n+1th scan clock signal SCCLK(n+1) may be applied to the n+1th scan clock node NC12.

An n+1th capacitor C2 may be formed between the gate node of the pull-up transistor T6 of the n+1th scan output buffer SCBUF(n+1) and the n+1th scan output node O12.

The pull-down transistor T7 of the n+1th scan output buffer SCBUF(n+1) may control the connection between the n+1th scan output node O12 and the first low-potential voltage node NLV1. The first low-potential voltage GVSS1 may be applied to the first low-potential voltage node NLV1.

The pull-up transistor T6 of the n+2th scan output buffer SCBUF(n+2) may control the connection between the n+2th scan clock node NC13 and the n+2th scan output node O13. The n+2th scan clock signal SCCLK(n+2) may be applied to the n+2th scan clock node NC13.

An n+2th capacitor C3 may be formed between the gate node of the pull-up transistor T6 of the n+2th scan output buffer SCBUF(n+2) and the n+2th scan output node O13.

The pull-down transistor T7 of the n+2th scan output buffer SCBUF(n+2) may control the connection between the n+2th scan output node O13 and the first low-potential voltage node NLV1. The first low-potential voltage GVSS1 may be applied to the first low-potential voltage node NLV1.

The pull-up transistor T6 of the n+3th scan output buffer SCBUF(n+3) may control the connection between the n+3th scan clock node NC14 and the n+3th scan output node O14. The n+3th scan clock signal SCCLK(n+3) may be applied to the n+3th scan clock node NC14.

An n+3th capacitor C4 may be formed between the gate node of the pull-up transistor T6 of the n+3th scan output buffer SCBUF(n+3) and the n+3th scan output node O14.

The pull-down transistor T7 of the n+3th scan output buffer SCBUF(n+3) may control the connection between the n+3th scan output node O14 and the first low-potential voltage node NLV1. The first low-potential voltage GVSS1 may be applied to the first low-potential voltage node NLV1.

The gate nodes of the respective pull-up transistors T6 of the nth to (n+k−1)th scan output buffers SCBUF(n) to SCBUF(n+3) may be commonly connected to the first Q node Q1.

The gate nodes of the respective pull-down transistors T7 of the nth to (n+k−1)th scan output buffers SCBUF(n) to SCBUF(n+3) may be commonly connected to the first QB node QB1.

Referring to FIG. 12, the first buffer group BUF_GR1 may further include an nth carry output buffer CRBUF(n).

The nth carry output buffer CRBUF(n) may include a carry pull-up transistor T6*cr* and a carry pull-down transistor T7*cr*.

The pull-up transistor T6*cr* of the nth carry output buffer CRBUF(n) may control the connection between the nth carry clock node NCR1 and the nth carry output node OC1. The nth carry clock signal CRCLK(n) may be applied to the nth carry clock node NCR1.

A carry capacitor CCR may be formed between the gate node of the pull-up transistor T6*cr* of the nth carry output buffer CRBUF(n) and the nth carry output node OC1.

The pull-down transistor T7*cr* of the nth carry output buffer CRBUF(n) may control the connection between the nth carry output node OC1 and the third low-potential voltage node NLV3. The third low-potential voltage GVSS3 may be applied to the third low-potential voltage node NLV3.

The gate node of the carry pull-up transistor T6*cr* of the nth carry output buffer CRBUF(n) may be commonly connected to the first Q node Q1 together with the gate nodes of the respective pull-up transistors T6 of nth to (n+k−1)th scan output buffers SCBUF(n) to SCBUF(n+3).

The gate node of the carry pull-down transistor T7*cr* of the nth carry output buffer CRBUF(n) may be commonly connected to the first QB node QB1 together with the gate nodes of the respective pull-down transistors T7 of nth to (n+k−1)th scan output buffers SCBUF(n) to SCBUF(n+3).

Referring to FIG. 12, the first sensing unit RTS1 may include a first sensing Q node charging circuit SQC1, a first sensing Q node discharging circuit SQD1, and a first sensing QB node discharging circuit SQBD1.

The first sensing Q node charging circuit SQC1 may include a first reset transistor T1*c* including a first node (drain node or source node) to which the first common control signal RT1 is applied, a second node (source node or drain node) electrically connected to the first Q node Q1, and a third node (gate node) to which the reset signal RESET is applied.

The first sensing QB node discharging circuit SQBD1 may include a first reset transistor T5*a* including a first node to which the second common control signal RT2 is applied, a second node electrically connected to the first QB node QB1, and a third node to which the reset signal RESET is applied.

The first sensing Q node discharging circuit SQD1 may include two transistors T3*nb* and T3*nc* connected in series between the first Q node Q1 and the third low-potential voltage node NLV3. In the first sensing Q node discharging circuit SQD1, the respective gate nodes of the two transistors T3*nb* and T3*nc* may be electrically connected and commonly receive a common start signal VST. In the first sensing Q node discharging circuit SQD1, a point where the two transistors T3*nb* and T3*nc* are connected may be the first QH node QH1.

Referring to FIG. 12, the first logic unit LOGIC1 may include a first individual logic unit and a first common logic unit. The first individual logic unit of the first logic unit LOGIC1 may include a first QH control circuit QHCTR1, a first normal Q node charging circuit NQC1, and a first normal Q node discharging circuit NQD1.

The first normal Q node charging circuit NQC1 may include a first transistor T1 and a second transistor T1*a* connected in series between the first high-potential voltage node NHV1 to which the first high-potential voltage GVDD1 is applied and the first Q node Q1. The respective gate nodes of the first transistor T1 and the second transistor T1*a* may be electrically connected to commonly receive the front-end carry signal C(n−2).

The first normal Q node charging circuit NQC1 may further include a third transistor T11 and a fourth transistor T11' connected in series between the connection node of the first transistor T1 and the second transistor T1*a* and the third high-potential voltage node NHV3 to which the third high-potential voltage GVDD3 is applied. The respective gate nodes of the third transistor T11 and the fourth transistor T11' may be commonly connected to the third high-potential voltage node NHV3. The third transistor T11 and the fourth transistor T11' may be in a diode connection state.

The first QH control circuit QHCTR1 may include hold control transistors T3*q* and T3*q*' for controlling the connection between the first high-potential voltage node NHV1 and the first QH node QH1 (also referred to as a first Q hold node). The gate nodes of the hold control transistors T3*q* and T3*q*' may be electrically connected to the first Q node Q1.

The first QH control circuit QHCTR1 may maintain the voltage of the first QH node QH1 as a high-level voltage GVDD1 when the first Q node Q1 is enabled (high-level voltage) during the display driving period.

The first normal Q node discharging circuit NQD1 may include transistors T3*n* and T3*na* for controlling the connection between the first Q node Q1 and the third low-potential voltage node NLV3 to which the third low-potential voltage GVSS3 is applied according to the rear-end carry signal C(n+2) applied to the gate node.

Referring to FIG. 12, the first common logic unit of the first logic unit LOGIC1 may include a first normal QB node discharging circuit NQBD1/2, a first QB node control circuit QBCTR1/2, and a first Q node control circuit QCTR1/2.

The first QB node control circuit QBCTR1/2 may include a first QB charging transistor T4 for controlling the connection between the first QB node QB1 and the second high-potential voltage node NHV2 to which the second high-potential voltage GVDD2 is applied.

The first QB node control circuit QBCTR1/2 may further include a first control transistor T41 for controlling the connection between the gate node of the first QB charging transistor T4 and the second high-potential voltage node NHV2, and the gate node of the first control transistor T41 may be connected to the second high-potential voltage node NHV2.

The first QB node control circuit QBCTR1/2 may further include a second control transistor T4*q* for controlling the connection between the gate node of the first QB charging transistor T4 and the second low-potential voltage node NLV2 to which the second low-potential voltage GVSS2 is applied, and the gate node of the second control transistor T4*q* may be electrically connected to the first Q node Q1.

The first Q node control circuit QCTR1/2 may include a third control transistor T3 and a fourth control transistor T3*a* connected in series between the first Q node Q1 and the third low-potential voltage node NLV3. The gate nodes of the third control transistor T3 and the fourth control transistor T3*a* may be commonly connected to the first QB node QB1. The connection node of the third control transistor T3 and the fourth control transistor T3*a* may be connected to the first QH node QH1. The first Q node control circuit QCTR1/2 may perform a voltage stabilization function on the first Q node Q1. When the first Q node Q1 is to be the low-level voltage GVSS3, the first Q node control circuit QCTR1/2 may maintain the voltage of the first Q node Q1 as the low level voltage GVSS3.

The first normal QB node discharging circuit NQBD1/2 may include a first QB discharging transistor T5 for controlling the connection between the first QB node QB1 and the third low-potential voltage node NLV3 according to the front-end carry signal C(n−2) applied to the gate node.

The first normal QB node discharging circuit NQBD1/2 may further include a second QB discharging transistor T5q for controlling the connection between the first QB node QB1 and the third low-potential voltage node NLV3, and the gate node of the second QB discharging transistor T5q may be electrically connected to the first Q node Q1.

Figure 13:
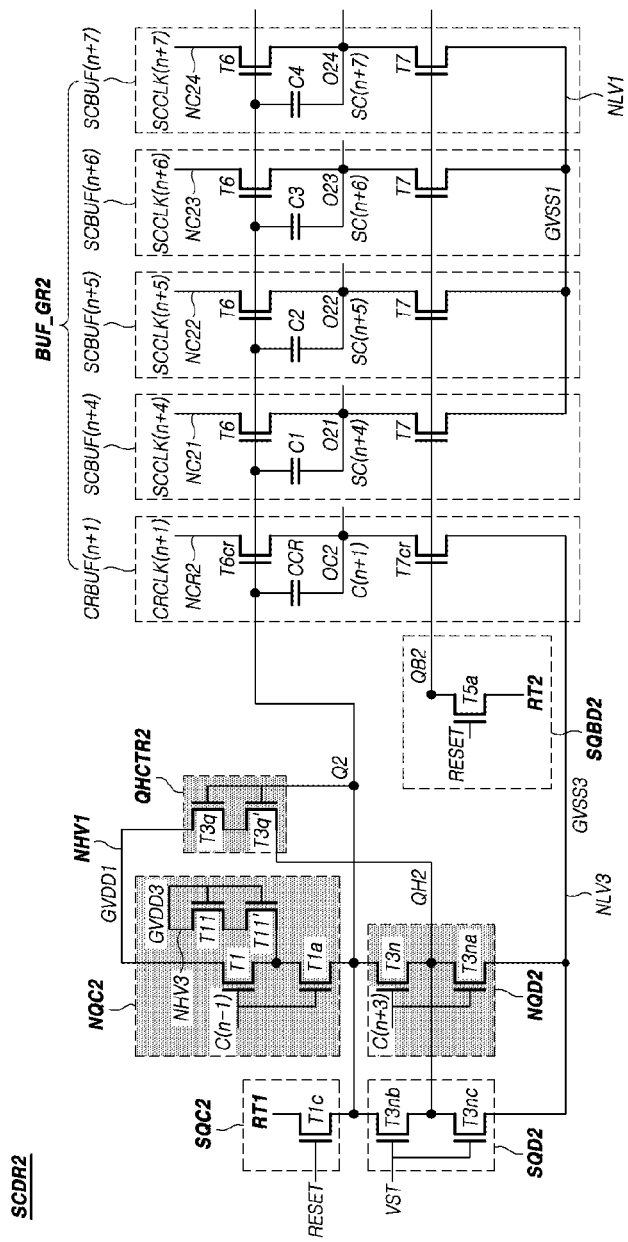
FIG. 13 is a view illustrating a second scan driving circuit included in a gate driving circuit having a low-area structure according to embodiments of the disclosure.

FIG. 13 is a view illustrating a second scan driving circuit SCDR2 included in a gate driving circuit 130 having a low-area structure according to embodiments of the disclosure.

Referring to FIG. 13, the second scan driving circuit SCDR2 may include a second buffer group BUF_GR2 including the (n+k)th to (n+2k−1)th scan output buffers SCBUF(n+4) to SCBUF(n+7) electrically connected to the (n+k)th to (n+2k−1)th scan lines SCL(n+4) to SCL(n+7), a second logic unit LOGIC2 for controlling the second buffer group BUF_GR2 during the display driving period, and a second sensing unit RTS2 for controlling the second buffer group BUF_GR2 during the sensing driving period.

Referring to FIG. 13, the second scan driving circuit SCDR2 may have the same structure as the first scan driving circuit SCDR1 except that it does not include the first common logic unit included in the first scan driving circuit SCDR1.

Referring to FIG. 13, since the second scan driving circuit SCDR2 does not include the first common logic unit included in the first scan driving circuit SCDR1, the area of the second scan driving circuit SCDR2 may be smaller than the area of the first scan driving circuit SCDR1.

Referring to FIG. 13, the second buffer group BUF_GR2 of the second scan driving circuit SCDR2 may include (n+k)th to (n+2k−1)th scan output buffers SCBUF(n+4) to SCBUF(n+7).

The (n+k)th to (n+2k−1)th scan output buffers SCBUF(n+4) to SCBUF(n+7), respectively, may be configured to receive the (n+k)th to (n+2k−1)th scan clock signals SCCLK(n+4) to SCCLK(n+7) and output the (n+k)th to (n+2k−1)th scan signals SC(n+4) to SC(n+7) to the (n+k)th to (n+2k−1)th scan output nodes OC21, OC22, OC23, and OC24, respectively.

Each of the (n+k)th to (n+2k−1)th scan output buffers SCBUF(n+4) to SCBUF(n+7) may include a pull-up transistor T6 and a pull-down transistor T7.

The gate nodes of the respective pull-up transistors T6 of the (n+k)th to (n+2k−1)th scan output buffers SCBUF(n+4) to SCBUF(n+7) may be commonly connected to the second Q node Q2.

The gate nodes of the respective pull-down transistors T7 of the (n+k)th to (n+2k−1)th scan output buffers SCBUF(n+4) to SCBUF(n+7) may be commonly connected to the second QB node QB2.

The second buffer group BUF_GR2 of the second scan driving circuit SCDR2 may further include an n+1th carry output buffer CRBUF(n+1) including a carry pull-up transistor T6cr and a carry pull-down transistor T7cr.

The n+1th carry output buffer CRBUF(n+1) may be configured to receive the n+1th carry clock signal CRCLK(n+1) and output the n+1th carry signal C(n+1) to the n+1th carry output node OC2.

The gate node of the carry pull-up transistor T6cr of the n+1th carry output buffer CRBUF(n+1) may be commonly connected to the second Q node Q2 together with the gate nodes of the respective pull-up transistors T6 of (n+k)th to (n+2k−1)th scan output buffers SCBUF(n+4) to SCBUF(n+7).

The gate node of the carry pull-down transistor T7cr of the n+1th carry output buffer CRBUF(n+1) may be commonly connected to the second QB node QB2 together with the gate nodes of the respective pull-down transistors T7 of (n+k)th to (n+2k−1)th scan output buffers SCBUF(n+4) to SCBUF(n+7).

The (n+k)th to (n+2k−1)th scan output buffers SCBUF(n+4) to SCBUF(n+7) may include a capacitor C1 to C4 between the gate node and source node (or drain node) of the pull-up transistor T6.

The n+1th carry output buffer CRBUF(n+1) may include a capacitor CCR between the gate node and the source node (or drain node) of the carry pull-up transistor T6cr.

Referring to FIG. 13, the second sensing unit RTS2 may include a second sensing Q node charging circuit SQC2, a second sensing Q node discharging circuit SQD2, and a second sensing QB node discharging circuit SQBD2.

Referring to FIG. 13, the second sensing Q node charging circuit SQC2 may include a second reset transistor T1c including a first node (drain node or source node) to which the first common control signal RT1 is applied, a second node (source node or drain node) electrically connected to the second Q node Q2, and a third node (gate node) to which the reset signal RESET is applied.

Referring to FIG. 13, the second sensing QB node discharging circuit SQBD2 may include a second reset transistor T5a including a first node to which the second common control signal RT2 is applied, a second node electrically connected to the second QB node QB2, and a third node to which the reset signal RESET is applied.

Referring to FIG. 13, the second sensing Q node discharging circuit SQD2 may include two transistors T3nb and T3nc connected in series between the second Q node Q2 and the third low-potential voltage node NLV3. In the second sensing Q node discharging circuit SQD2, the respective gate nodes of the two transistors T3nb and T3nc may be electrically connected and commonly receive a common start signal VST. In the second sensing Q node discharging circuit SQD2, a point where the two transistors T3nb and T3nc are connected may be the second QH node QH2.

Referring to FIG. 13, the second logic unit LOGIC2 may include a second individual logic unit. The second individual logic unit may include a second QH control circuit QHCTR2, a second normal Q node charging circuit NQC2, and a second normal Q node discharging circuit NQD2.

The second normal Q node charging circuit NQC2 may include a first transistor T1 and a second transistor T1a connected in series between the first high-potential voltage node NHV1 and the second Q node Q2. The respective gate nodes of the first transistor T1 and the second transistor T1a may be electrically connected to commonly receive the front-end carry signal C(n−1).

The second normal Q node charging circuit NQC2 may further include a third transistor T11 and a fourth transistor T11' connected in series between the connection node of the first transistor T1 and the second transistor T1a and the third high-potential voltage node NHV3 to which the third high-potential voltage GVDD3 is applied. The respective gate nodes of the third transistor T11 and the fourth transistor T11' may be commonly connected to the third high-potential voltage node NHV3. The third transistor T11 and the fourth transistor T11' may be in a diode connection state.

The second QH control circuit QHCTR2 may include hold control transistors T3q and T3q' for controlling the connection between the first high-potential voltage node NHV1 and the second QH node QH2 (also referred to as a second Q hold node). The gate nodes of the hold control transistors T3q and T3q' may be electrically connected to the second Q node Q2.

The second normal Q node discharging circuit NQD2 may include transistors T3n and T3na for controlling the connection between the second Q node Q2 and the third low-potential voltage node NLV3 to which the third low-potential voltage GVSS3 is applied according to the rear-end carry signal C(n+3) applied to the gate node.

Figure 14:
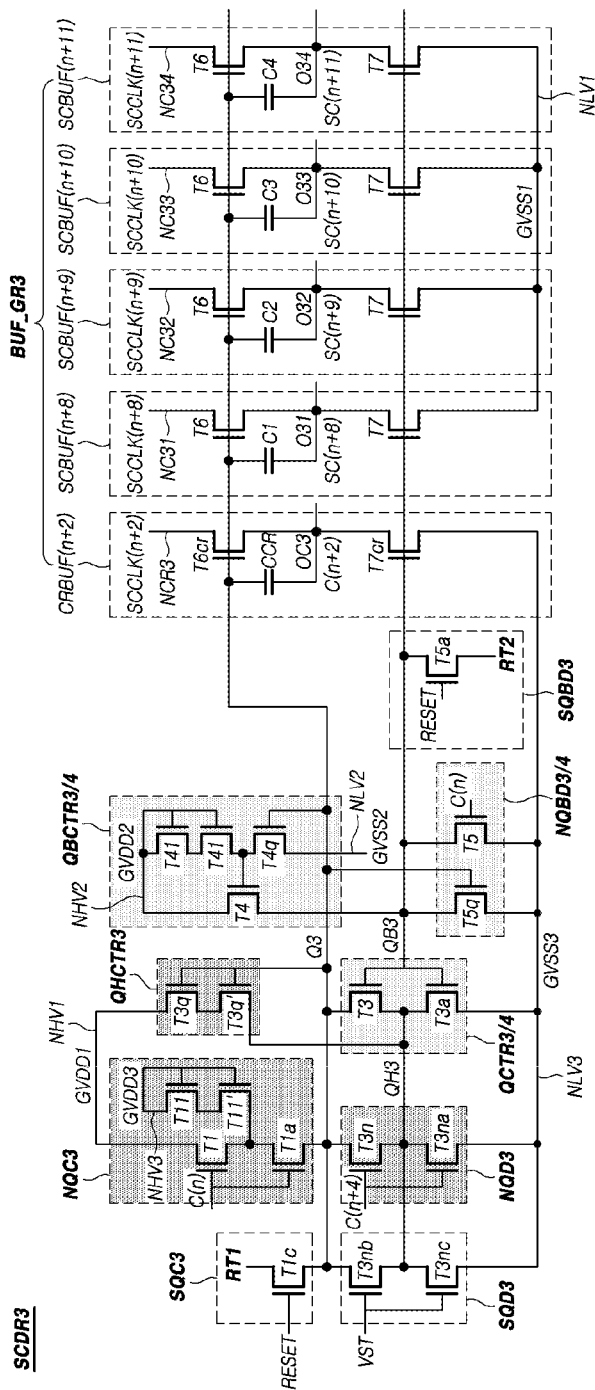
FIG. 14 is a view illustrating a third scan driving circuit included in a gate driving circuit having a low-area structure according to embodiments of the disclosure.

FIG. 14 is a view illustrating a third scan driving circuit SCDR3 included in a gate driving circuit 130 having a low-area structure according to embodiments of the disclosure.

Referring to FIG. 14, the third scan driving circuit SCDR3 may have substantially the same structure as the first scan driving circuit SCDR1 except for a difference in step sequence.

Referring to FIG. 14, the third scan driving circuit SCDR3 may include a third buffer group BUF_GR3 including the (n+2k)th to (n+3k−1)th scan output buffers SCBUF(n+8) to SCBUF(n+11) electrically connected to the (n+2k)th to (n+3k−1)th scan lines SCL(n+8) to SCL(n+11), a third logic unit LOGIC3 for controlling the third buffer group BUF_GR3 during the display driving period, and a third sensing unit RTS3 for controlling the third buffer group BUF_GR3 during the sensing driving period.

Referring to FIG. 14, the third buffer group BUF_GR3 of the third scan driving circuit SCDR3 may include (n+2k)th to (n+3k−1)th scan output buffers SCBUF(n+8) to SCBUF(n+11).

The (n+2k)th to (n+3k−1)th scan output buffers SCBUF(n+8) to SCBUF(n+11), respectively, may be configured to receive the (n+2k)th to (n+3k−1)th scan clock signals SCCLK(n+8) to SCCLK(n+11) and output the (n+2k)th to (n+3k−1)th scan signals SC(n+8) to SC(n+11) to the (n+2k)th to (n+3k−1)th scan output nodes OC31, OC32, OC33, and OC34, respectively.

Each of the (n+2k)th to (n+3k−1)th scan output buffers SCBUF(n+8) to SCBUF(n+11) may include a pull-up transistor T6 and a pull-down transistor T7.

The gate nodes of the respective pull-up transistors T6 of the (n+2k)th to (n+3k−1)th scan output buffers SCBUF(n+8) to SCBUF(n+11) may be commonly connected to the third Q node Q3.

The gate nodes of the respective pull-down transistors T7 of the (n+2k)th to (n+3k−1)th scan output buffers SCBUF(n+8) to SCBUF(n+11) may be commonly connected to the third QB node QB3.

The third buffer group BUF_GR3 of the third scan driving circuit SCDR3 may further include an n+2th carry output buffer CRBUF(n+2) including a carry pull-up transistor T6cr and a carry pull-down transistor T7cr.

The n+2th carry output buffer CRBUF(n+2) may be configured to receive the n+2th carry clock signal CRCLK(n+2) and output the n+2th carry signal C(n+2) to the n+2th carry output node OC3.

The gate node of the carry pull-up transistor T6cr of the n+2th carry output buffer CRBUF(n+2) may be commonly connected to the third Q node Q3 together with the gate nodes of the respective pull-up transistors T6 of (n+2k)th to (n+3k−1)th scan output buffers SCBUF(n+8) to SCBUF(n+11).

The gate node of the carry pull-down transistor T7cr of the n+2th carry output buffer CRBUF(n+2) may be commonly connected to the third QB node QB3 together with the gate nodes of the respective pull-down transistors T7 of (n+2k)th to (n+3k−1)th scan output buffers SCBUF(n+8) to SCBUF(n+11).

The (n+2k)th to (n+3k−1)th scan output buffers SCBUF(n+8) to SCBUF(n+11) may include a capacitor C1 to C4 between the gate node and source node (or drain node) of the pull-up transistor T6.

The n+2th carry output buffer CRBUF(n+2) may include a capacitor CCR between the gate node and the source node (or drain node) of the carry pull-up transistor T6cr.

Referring to FIG. 14, the third sensing unit RTS3 may include a third sensing Q node charging circuit SQC3, a third sensing Q node discharging circuit SQD3, and a third sensing QB node discharging circuit SQBD3.

The third sensing Q node charging circuit SQC3 may include a first reset transistor T1c including a first node (drain node or source node) to which the first common control signal RT1 is applied, a second node (source node or drain node) electrically connected to the third Q node Q3, and a third node (gate node) to which the reset signal RESET is applied.

The third sensing QB node discharging circuit SQBD3 may include a first reset transistor T5a including a first node to which the second common control signal RT2 is applied, a second node electrically connected to the third QB node QB3, and a third node to which the reset signal RESET is applied.

The third sensing Q node discharging circuit SQD3 may include two transistors T3nb and T3nc connected in series between the third Q node Q3 and the third low-potential voltage node NLV3. In the third sensing Q node discharging circuit SQD3, the respective gate nodes of the two transistors T3nb and T3nc may be electrically connected and commonly receive a common start signal VST. In the third sensing Q node discharging circuit SQD3, a point where the two transistors T3nb and T3nc are connected may be the third QH node QH3.

Referring to FIG. 14, the third logic unit LOGIC3 may include a third individual logic unit and a third common logic unit. The third individual logic unit of the third logic unit LOGIC3 may include a third QH control circuit QHCTR3, a third normal Q node charging circuit NQC3, and a third normal Q node discharging circuit NQD3.

The third normal Q node charging circuit NQC3 may include a first transistor T1 and a second transistor T1a connected in series between the first high-potential voltage node NHV1 to which the first high-potential voltage GVDD1 is applied and the third Q node Q3. The respective gate nodes of the first transistor T1 and the second transistor T1a may be electrically connected to commonly receive the front-end carry signal C(n).

The third normal Q node charging circuit NQC3 may further include a third transistor T11 and a fourth transistor T11' connected in series between the connection node of the first transistor T1 and the second transistor T1a and the third high-potential voltage node NHV3 to which the third high-potential voltage GVDD3 is applied. The respective gate nodes of the third transistor T11 and the fourth transistor T11' may be commonly connected to the third high-potential voltage node NHV3. The third transistor T11 and the fourth transistor T11' may be in a diode connection state.

The third QH control circuit QHCTR3 may include hold control transistors T3q and T3q' for controlling the connection between the first high-potential voltage node NHV1 and the third QH node QH3 (also referred to as a third Q hold node). The gate nodes of the hold control transistors T3q and T3q' may be electrically connected to the third Q node Q3.

The third normal Q node discharging circuit NQD3 may include transistors T3n and T3na for controlling the connection between the third Q node Q3 and the third low-potential voltage node NLV3 to which the third low-potential voltage GVSS3 is applied according to the rear-end carry signal C(n+4) applied to the gate node.

Referring to FIG. 14, the third common logic unit QBCTR3/4, QCTR3/4, and NQBD3/4 of the third logic unit LOGIC3 may include a third normal QB node discharging circuit NQBD3/4, a third QB node control circuit QBCTR3/4, and a third Q node control circuit QCTR3/4.

The third QB node control circuit QBCTR3/4 may include a first QB charging transistor T4 for controlling the connection between the third QB node QB3 and the second high-potential voltage node NHV2 to which the second high-potential voltage GVDD2 is applied.

The third QB node control circuit QBCTR3/4 may further include a first control transistor T41 for controlling the connection between the gate node of the first QB charging transistor T4 and the second high-potential voltage node NHV2, and the gate node of the first control transistor T41 may be connected to the second high-potential voltage node NHV2.

The third QB node control circuit QBCTR3/4 may further include a second control transistor T4q for controlling the connection between the gate node of the first QB charging transistor T4 and the second low-potential voltage node NLV2 to which the second low-potential voltage GVSS2 is applied, and the gate node of the second control transistor T4q may be electrically connected to the third Q node Q3.

The third Q node control circuit QCTR3/4 may include a third control transistor T3 and a fourth control transistor T3a connected in series between the third Q node Q3 and the third low-potential voltage node NLV3. The gate nodes of the third control transistor T3 and the fourth control transistor T3a may be commonly connected to the third QB node QB3. The connection node of the third control transistor T3 and the fourth control transistor T3a may be connected to the third QH node QH3.

The third normal QB node discharging circuit NQBD3/4 may include a first QB discharging transistor T5 for controlling the connection between the third QB node QB3 and the third low-potential voltage node NLV3 according to the front-end carry signal C(n) applied to the gate node.

The third normal QB node discharging circuit NQBD3/4 may further include a second QB discharging transistor T5q for controlling the connection between the third QB node QB3 and the third low-potential voltage node NLV3, and the gate node of the second QB discharging transistor T5q may be electrically connected to the third Q node Q3.

Figure 15:
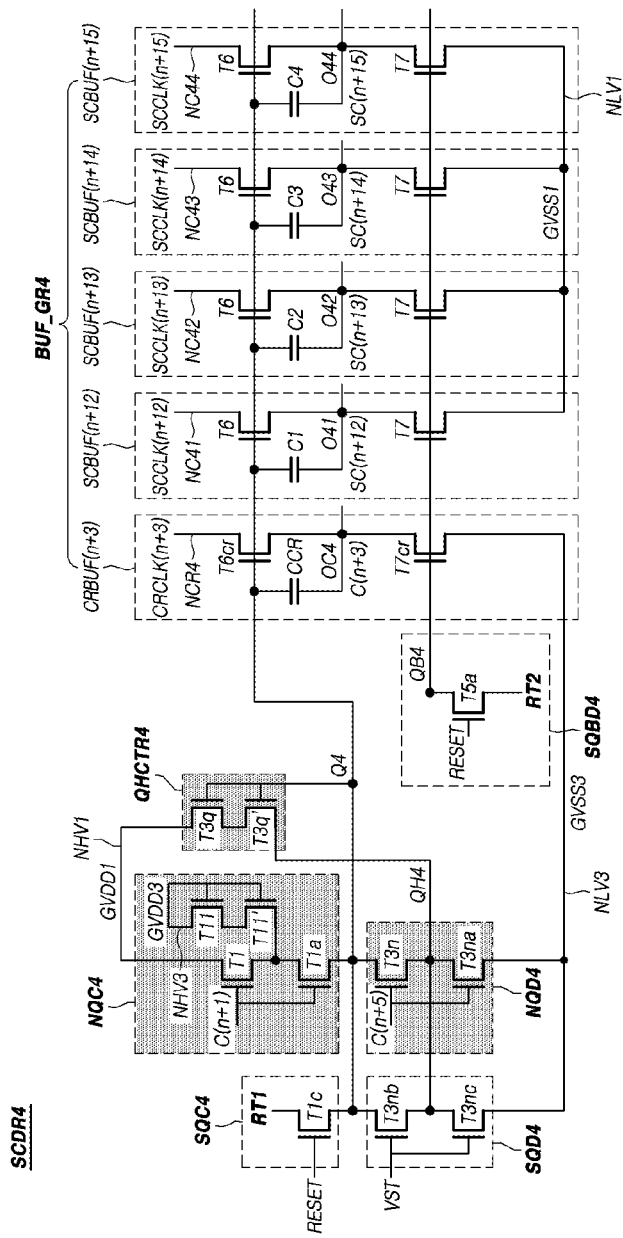
FIG. 15 is a view illustrating a fourth scan driving circuit included in a gate driving circuit having a low-area structure according to embodiments of the disclosure.

FIG. 15 is a view illustrating a fourth scan driving circuit SCDR4 included in a gate driving circuit 130 having a low-area structure according to embodiments of the disclosure.

Referring to FIG. 15, the fourth scan driving circuit SCDR4 may include a fourth buffer group BUF_GR4 including the (n+3k)th to (n+4k−1)th scan output buffers SCBUF(n+12) to SCBUF(n+15) electrically connected to the (n+3k)th to (n+4k−1)th scan lines SCL(n+12) to SCL(n+15), a fourth logic unit LOGIC4 for controlling the fourth buffer group BUF_GR4 during the display driving period, and a fourth sensing unit RTS4 for controlling the fourth buffer group BUF_GR4 during the sensing driving period.

Referring to FIG. 15, the fourth scan driving circuit SCDR4 may have the same structure as the third scan driving circuit SCDR3 except that it does not include the third common logic unit included in the third scan driving circuit SCDR3.

Referring to FIG. 15, since the fourth scan driving circuit SCDR4 does not include the third common logic unit included in the third scan driving circuit SCDR3, the area of the fourth scan driving circuit SCDR4 may be smaller than the area of the third scan driving circuit SCDR3.

Referring to FIG. 15, the fourth buffer group BUF_GR4 of the fourth scan driving circuit SCDR4 may include (n+3k)th to (n+4k−1)th scan output buffers SCBUF(n+12) to SCBUF(n+15).

Referring to FIG. 15, the (n+3k)th to (n+4k−1)th scan output buffers SCBUF(n+12) to SCBUF(n+15), respectively, may be configured to receive the (n+3k)th to (n+4k−1)th scan clock signals SCCLK(n+12) to SCCLK(n+15) and output the (n+3k)th to (n+4k−1)th scan signals SC(n+12) to SC(n+15) to the (n+3k)th to (n+4k−1)th scan output nodes OC41, OC42, OC43, and OC44, respectively.

Each of the (n+3k)th to (n+4k−1)th scan output buffers SCBUF(n+12) to SCBUF(n+15) may include a pull-up transistor T6 and a pull-down transistor T7.

The gate nodes of the respective pull-up transistors T6 of the (n+3k)th to (n+4k−1)th scan output buffers SCBUF(n+12) to SCBUF(n+15) may be commonly connected to the fourth Q node Q4.

The gate nodes of the respective pull-down transistors T7 of the (n+3k)th to (n+4k−1)th scan output buffers SCBUF(n+12) to SCBUF(n+15) may be commonly connected to the fourth QB node QB4.

The fourth buffer group BUF_GR4 of the fourth scan driving circuit SCDR4 may further include an n+3th carry output buffer CRBUF(n+3) including a carry pull-up transistor T6cr and a carry pull-down transistor T7cr.

The n+3th carry output buffer CRBUF(n+3) may be configured to receive the n+3th carry clock signal CRCLK(n+3) and output the n+3th carry signal C(n+3) to the n+3th carry output node OC4.

The gate node of the carry pull-up transistor T6cr of the n+3th carry output buffer CRBUF(n+3) may be commonly connected to the fourth Q node Q4 together with the gate nodes of the respective pull-up transistors T6 of (n+3k)th to (n+4k−1)th scan output buffers SCBUF(n+12) to SCBUF(n+15).

The gate node of the carry pull-down transistor T7cr of the n+3th carry output buffer CRBUF(n+3) may be commonly connected to the fourth QB node QB4 together with the gate nodes of the respective pull-down transistors T7 of (n+3k)th to (n+4k−1)th scan output buffers SCBUF(n+12) to SCBUF(n+15).

The (n+3k)th to (n+4k−1)th scan output buffers SCBUF(n+12) to SCBUF(n+15) may include a capacitor C1 to C4 between the gate node and source node (or drain node) of the pull-up transistor T6.

The n+3th carry output buffer CRBUF(n+3) may include a capacitor CCR between the gate node and the source node (or drain node) of the carry pull-up transistor T6cr.

Referring to FIG. 15, the fourth sensing unit RTS4 may include a fourth sensing Q node charging circuit SQC4, a fourth sensing Q node discharging circuit SQD4, and a fourth sensing QB node discharging circuit SQBD4.

Referring to FIG. 15, the fourth sensing Q node charging circuit SQC4 may include a first reset transistor T1c including a first node (drain node or source node) to which the first common control signal RT1 is applied, a second node (source node or drain node) electrically connected to the fourth Q node Q4, and a third node (gate node) to which the reset signal RESET is applied.

Referring to FIG. 15, the fourth sensing QB node discharging circuit SQBD4 may include a second reset transistor T5a including a first node to which the second common control signal RT2 is applied, a second node electrically connected to the fourth QB node QB4, and a third node to which the reset signal RESET is applied.

Referring to FIG. 15, the fourth sensing Q node discharging circuit SQD4 may include two transistors T3nb and T3nc connected in series between the fourth Q node Q4 and the third low-potential voltage node NLV3. In the fourth sensing Q node discharging circuit SQD4, the respective gate nodes of the two transistors T3nb and T3nc may be electrically connected and commonly receive a common start signal VST. In the fourth sensing Q node discharging circuit SQD4, a point where the two transistors T3nb and T3nc are connected may be the fourth QH node QH4.

Referring to FIG. 15, the fourth logic unit LOGIC2 may include a fourth individual logic unit. The fourth individual logic unit may include a fourth QH control circuit QHCTR4, a fourth normal Q node charging circuit NQC4, and a fourth normal Q node discharging circuit NQD4.

The fourth normal Q node charging circuit NQC4 may include a first transistor T1 and a second transistor T1a connected in series between the first high-potential voltage node NHV1 and the fourth Q node Q4. The respective gate nodes of the first transistor T1 and the second transistor T1a may be electrically connected to commonly receive the front-end carry signal C(n+1).

The fourth normal Q node charging circuit NQC4 may further include a third transistor T11 and a fourth transistor T11' connected in series between the connection node of the first transistor T1 and the second transistor T1a and the third high-potential voltage node NHV3 to which the third high-potential voltage GVDD3 is applied. The respective gate nodes of the third transistor T11 and the fourth transistor T11' may be commonly connected to the third high-potential voltage node NHV3. The third transistor T11 and the fourth transistor T11' may be in a diode connection state.

The fourth QH control circuit QHCTR4 may include hold control transistors T3q and T3q' for controlling the connection between the first high-potential voltage node NHV1 and the fourth QH node QH4 (also referred to as a fourth Q hold node). The gate nodes of the hold control transistors T3q and T3q' may be electrically connected to the fourth Q node Q4.

The fourth normal Q node discharging circuit NQD4 may include transistors T3n and T3na for controlling the connection between the fourth Q node Q4 and the third low-potential voltage node NLV3 to which the third low-potential voltage GVSS3 is applied according to the rear-end carry signal C(n+5) applied to the gate node.

Figure 16:
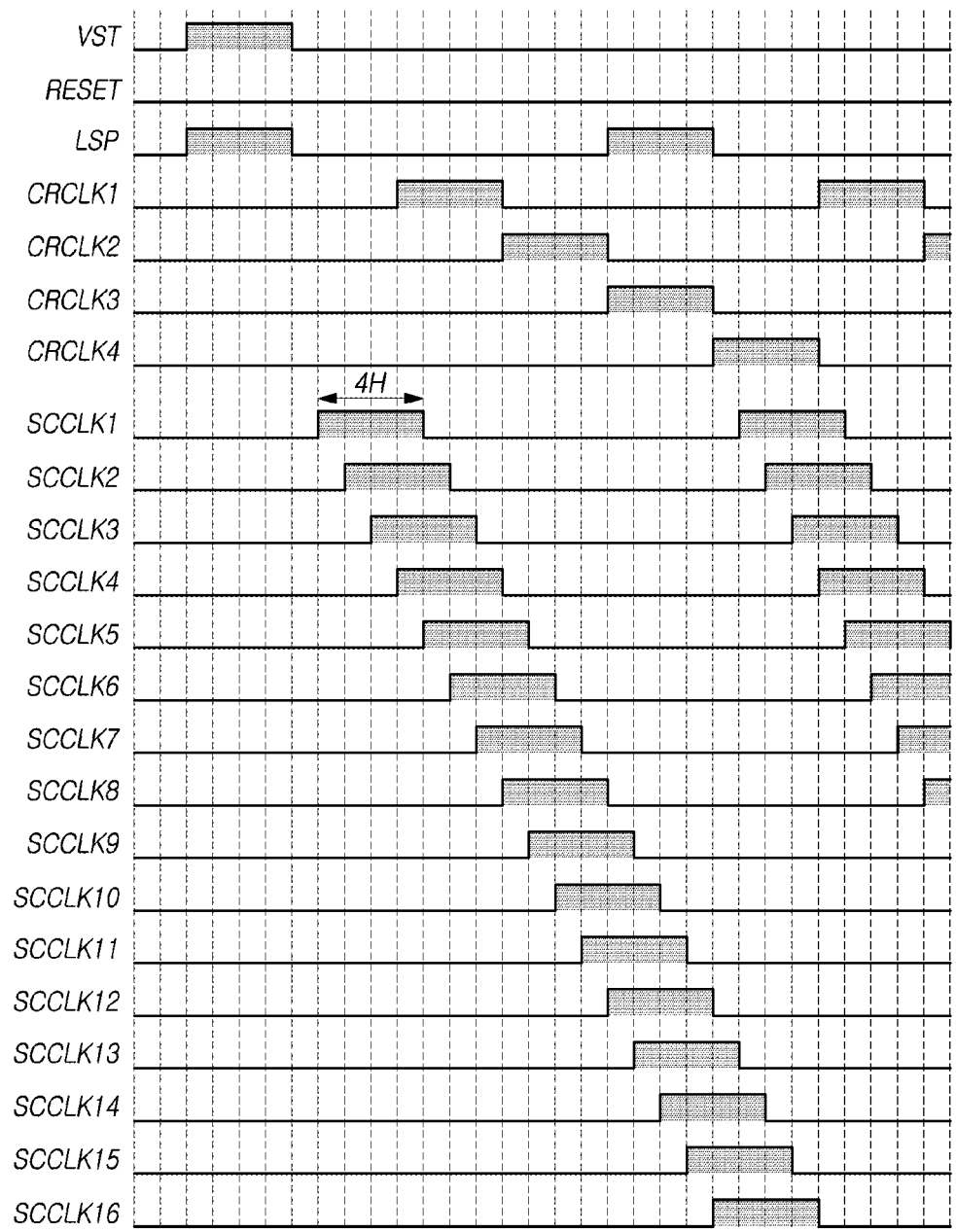
FIG. 16 is a first driving timing diagram of a gate driving circuit having a low-area structure according to embodiments of the disclosure.
Figure 17:
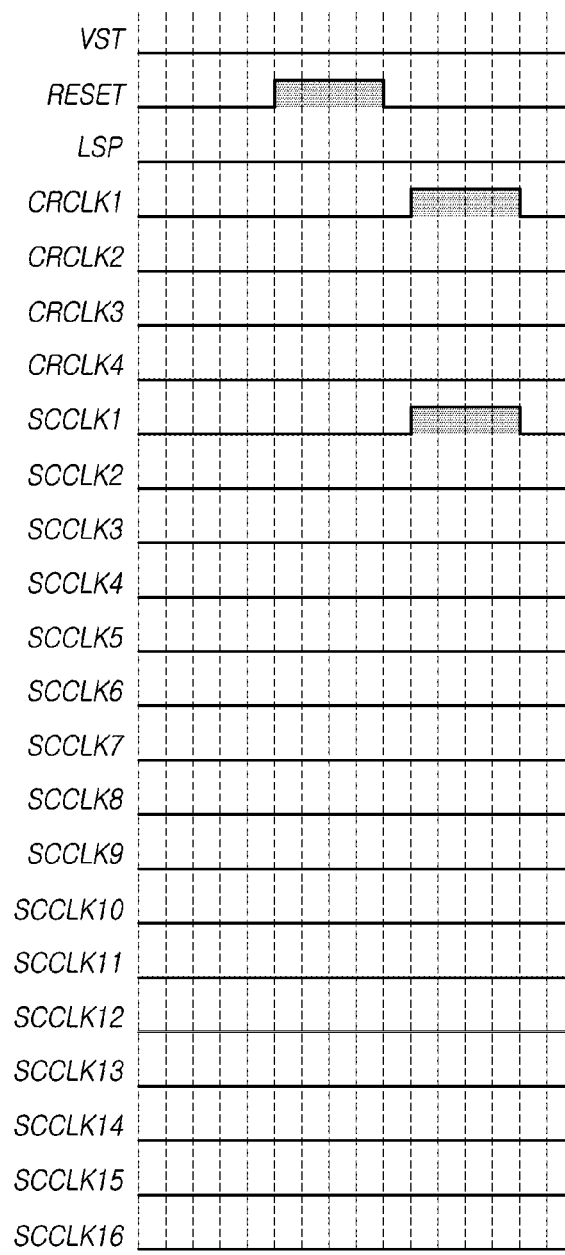
FIG. 17 is a second driving timing diagram of a gate driving circuit having a low-area structure according to embodiments of the disclosure.

FIG. 16 is a first driving timing diagram of a gate driving circuit 130 having a low-area structure according to embodiments of the disclosure, and FIG. 17 is a second driving timing diagram of a gate driving circuit 130 having a low-area structure according to embodiments of the disclosure. However, in FIG. 16, k is 4.

The first driving timing diagram of FIG. 16 is a driving timing diagram of the gate driving circuit 130 during the display driving period (active period ACT), and the second driving timing diagram of FIG. 17 is a driving timing diagram of the gate driving circuit 130 during the sensing driving period (blank period BLANK).

Referring to FIG. 16, during the display driving period, the gate driving circuit 130 may generate and output scan signals using 16 scan clock signals SCCLK1 to SCCLK16 and, when generating scan signals, the gate driving circuit 130 may further use four carry clock signals CRCLK1 to CRCLK4.

Referring to FIG. 16, the gate driving circuit 130 may perform driving using a start signal VST related to the start of a frame and a line selection signal LSP. Thus, the gate driving timing may be controlled.

Referring to FIG. 16, the scan signals output based on the 16 scan clock signals SCCLK1 to SCCLK16 may include the same pulse (turn-on level voltage period) as one pulse waveform in each of the 16 scan clock signals SCCLK1 to SCCLK16.

Referring to FIG. 16, the turn-on level voltage period (e.g., high-level voltage period) of each scan signal generated by the gate driving circuit 130 having a low-area structure may have a longer horizontal time (e.g., 4H) than one horizontal time (1H).

Referring to FIG. 16, each scan signal generated by the gate driving circuit 130 having a low-area structure may overlap the next scan signal.

For example, the high-level voltage period of each of the first to sixteenth scan clock signals SCCLK1 to SCCLK16 may have 4 horizontal times (4H). The first scan signal generated based on the first scan clock signal SCCLK1 may have a turn-on level voltage period (e.g., high-level voltage period) of 4H horizontal time. Similarly, the second scan signal generated based on the second scan clock signal SCCLK2 may have a turn-on level voltage period (e.g., high level voltage period) of 4H horizontal time. The high-level voltage period of the first scan clock signal SCCLK1 and the high-level voltage period of the second scan clock signal SCCLK2 may overlap in three horizontal times 3H. Accordingly, the turn-on level voltage period of the first scan signal generated based on the first scan clock signal SCCLK1 and the turn-on level voltage period of the second scan signal generated based on the second scan clock signal SCCLK2 may overlap in three horizontal times 3H.

Referring to FIG. 17, if the reset signal RESET is generated during the sensing driving period, the gate driving circuit 130 may generate and output a scan signal SCCLK1 for sensing driving according to a carry clock signal (e.g., CRCLK1) subsequently inputted.

Referring to FIG. 17, the reset signal RESET is a control signal inputted to the gate nodes of the first to fourth reset transistors T1c in the first to fourth sensing Q node charging circuits SQC1 to SQC4 included in the first to fourth sensing units RTS1 to RTS4.

The gate driving circuit 130 having a low-area structure according to embodiments of the disclosure, described above, is briefly described herein.

The gate driving circuit 130 having a low-area structure according to embodiments of the disclosure may include four buffer groups BUF_GR1 to BUF_GR4 for driving 4k scan lines SCL(n) to SCL(n+4k−1), two common logic units for controlling the four buffer groups BUF_GR1 to BUF_GR4, and one common sensing circuit COM_RTS for controlling to output a sensing driving scan signal to at least one scan line among the 4k scan lines SCL(n) to SCL(n+4k−1).

For example, when the Q node sharing range index, i.e., k, is 4, the gate driving circuit 130 having a low-area structure according to embodiments of the disclosure may include four buffer groups BUF_GR1 to BUF_GR4 for driving 16 scan lines SCL(n) to SCL(n+15), two common logic units for controlling the four buffer groups BUF_GR1 to BUF_GR4, and one common sensing circuit COM_RTS for controlling to output a sensing driving scan signal to at least one scan line among the 16 scan lines SCL(n) to SCL(n+15).

In sum, in the sharing structure described herein, one buffer group may correspond to four scan output channels. One common logic unit may correspond to eight scan output channels. One common sensing circuit may correspond to 18 scan output channels. Thus, the area of the gate driving circuit 130 may be significantly reduced, and so may the area of the gate driving circuit area GIPA in the non-display area NDA of the display panel 110.

According to embodiments of the disclosure as described herein, there may be provided a gate driving circuit having a low-area structure and a display device including the same.

According to embodiments of the disclosure, there may be provided a gate driving circuit having a low-area structure while normally performing a gate driving operation for sensing the mobility of a driving transistor in a subpixel and a display device including the same.

The description herein has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The description herein and the accompanying drawings provide an example of the technical idea of the present invention for illustrative purposes only. That is, the disclosed embodiments are intended to illustrate the scope of the technical idea of the present invention. Thus, the scope of the present invention is not limited to the embodiments shown. The scope of protection of the present invention should be construed based on the following claims, and all technical ideas within the scope of equivalents thereof should be construed as being included within the scope of the present invention.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A gate driving circuit, comprising:
a first scan driving circuit configured to output an nth to (n+k−1)th scan signal to an nth to (n+k−1)th scan line;
a second scan driving circuit configured to output an (n+k)th to (n+2k−1)th scan signal to an (n+k)th to (n+2k−1)th scan line;
a third scan driving circuit configured to output an (n+2k)th to (n+3k−1)th scan signal to an (n+2k)th to (n+3k−1)th scan line;
a fourth scan driving circuit configured to output an (n+3k)th to (n+4k−1)th scan signal to an (n+3k)th to (n+4k−1)th scan line; and
a common sensing circuit commonly connected with the first scan driving circuit, the second scan driving circuit, the third scan driving circuit, and the fourth scan driving circuit and configured to receive a line selection signal to output a first common control signal and a second common control signal to the first scan driving circuit, the second scan driving circuit, the third scan driving circuit, and fourth scan driving circuit,
wherein n is a natural number of 1 or more, and k is a natural number of 2 or more, and
wherein during a sensing driving period in operation, one of the first scan driving circuit, the second scan driving circuit, the third scan driving circuit, and the fourth scan driving circuit is configured to output a scan signal to a corresponding scan line among 4k scan lines responsive to a reset signal being input.

2. The gate driving circuit of claim 1, wherein the sensing driving period overlaps a blank period in operation.

3. The gate driving circuit of claim 1, wherein the gate driving circuit is a built-in-panel circuit disposed in a non-display area of a display panel.

4. The gate driving circuit of claim 1, wherein the common sensing circuit includes:
a first shared control transistor and a second shared control transistor connected in series between a front carry input node and a control node, a gate node of the first shared control transistor and a gate node of the second shared control transistor being commonly connected to allow the line selection signal to be commonly applied thereto;
a third shared control transistor for controlling connection between a first high-potential voltage node and a connection node of the first shared control transistor and the second shared control transistor according to a voltage of the control node;
a fourth shared control transistor for controlling connection between the first high-potential voltage node and a first common control node according to the voltage of the control node;
a fifth shared control transistor for controlling connection between a third low-potential voltage node and a second common control node according to the voltage of the control node; and
a capacitor between the control node and the first high-potential voltage node.

5. The gate driving circuit of claim 1, wherein the first scan driving circuit includes: a first buffer group including an nth to (n+k−1)th scan output buffer electrically connected with the nth to (n+k−1)th scan lines; a first logic unit configured to control the first buffer group during a display driving period; and a first sensing unit configured to control the first buffer group during the sensing driving period,
wherein the second scan driving circuit includes: a second buffer group including an (n+k)th to (n+2k−1)th scan output buffer electrically connected with the (n+k)th to (n+2k−1)th scan lines; a second logic unit configured to control the second buffer group during the display driving period; and a second sensing unit configured to control the second buffer group during the sensing driving period,
wherein the third scan driving circuit includes: a third buffer group including an (n+2k)th to (n+3k−1)th scan output buffer electrically connected with the (n+2k)th to (n+3k−1)th scan lines; a third logic unit configured to control the third buffer group during the display driving period; and a third sensing unit configured to control the third buffer group during the sensing driving period, and wherein the fourth scan driving circuit includes: a fourth buffer group including an (n+3k)th to (n+4k−1)th scan output buffer electrically connected with the (n+3k)th to (n+4k−1)th scan lines; a fourth logic unit configured to control the fourth buffer group during the display driving period; and a fourth sensing unit configured to control the fourth buffer group during the sensing driving period.

6. The gate driving circuit of claim 5, wherein each of the nth to (n+k−1)th scan output buffers includes a pull-up transistor and a pull-down transistor, gate nodes of respective pull-up transistors of the nth to (n+k−1)th scan output buffers being commonly connected to a first Q node, wherein each of the (n+k)th to (n+2k−1)th scan output buffers includes a pull-up transistor and a pull-down transistor, gate nodes of respective pull-up transistors of the (n+k)th to (n+2k−1)th scan output buffers being commonly connected to a second Q node, wherein each of the (n+2k)th to (n+3k−1)th scan output buffers includes a pull-up transistor and a pull-down transistor, gate nodes of respective pull-up transistors of the (n+2k)th to (n+3k−1)th scan output buffers being commonly connected to a third Q node, and wherein each of the (n+3)th to (n+4k−1)th scan output buffers includes a pull-up transistor and a pull-down transistor, gate nodes of respective pull-up transistors of the (n+3k)th to (n+4k−1)th scan output buffers being commonly connected to a fourth Q node.

7. The gate driving circuit of claim 6, wherein the first sensing unit includes a first sensing Q node charging circuit configured to charge the first Q node during the sensing driving period, a first sensing Q node discharging circuit configured to discharge the first Q node during the sensing driving period, and a first sensing QB node discharging circuit configured to discharge the first QB node during the sensing driving period;

wherein the second sensing unit includes a second sensing Q node charging circuit configured to charge the second Q node during the sensing driving period, a second sensing Q node discharging circuit configured to discharge the second Q node during the sensing driving period, and a second sensing QB node discharging circuit configured to discharge the second QB node during the sensing driving period;

wherein the third sensing unit includes a third sensing Q node charging circuit configured to charge the third Q node during the sensing driving period, a third sensing Q node discharging circuit configured to discharge the third Q node during the sensing driving period, and a third sensing QB node discharging circuit configured to discharge the third QB node during the sensing driving period; and wherein the fourth sensing unit includes a fourth sensing Q node charging circuit configured to charge the fourth Q node during the sensing driving period, a fourth sensing Q node discharging circuit configured to discharge the fourth Q node during the sensing driving period, and a fourth sensing QB node discharging circuit configured to discharge the fourth QB node during the sensing driving period.

8. The gate driving circuit of claim 7, wherein the first sensing Q node charging circuit includes a first reset transistor, the first reset transistor including a first node configured to receive the first common control signal, a second node electrically connected with the first Q node, and a third node configured to receive the reset signal, wherein the second sensing Q node charging circuit includes a second reset transistor, the second reset transistor including a first node configured to receive the first common control signal, a second node electrically connected with the second Q node, and a third node configured to receive the reset signal, wherein the third sensing Q node charging circuit includes a third reset transistor, the third reset transistor including a first node configured to receive the first common control signal, a second node electrically connected with the third Q node, and a third node configured to receive the reset signal, and wherein the fourth sensing Q node charging circuit includes a fourth reset transistor, the fourth reset transistor including a first node configured to receive the first common control signal, a second node electrically connected with the fourth Q node, and a third node configured to receive the reset signal.

9. The gate driving circuit of claim 7, wherein the first sensing QB node discharging circuit includes a first reset transistor, the first reset transistor including a first node configured to receive the second common control signal, a second node electrically connected with the first QB node, and a third node configured to receive the reset signal, wherein the second sensing QB node discharging circuit includes a second reset transistor, the second reset transistor including a first node configured to receive the second common control signal, a second node electrically connected with the second QB node, and a third node configured to receive the reset signal, wherein the third sensing QB node discharging circuit includes a third reset transistor, the third reset transistor including a first node configured to receive the second common control signal, a second node electrically connected with the third QB node, and a third node configured to receive the reset signal, and wherein the fourth sensing QB node discharging circuit includes a fourth reset transistor, the fourth reset transistor including a first node configured to receive the second common control signal, a second node electrically connected with the fourth QB node, and a third node configured to receive the reset signal.

10. The gate driving circuit of claim 7, further comprising:

a first common control line for transferring the first common control signal from the common sensing circuit commonly to the first to fourth sensing Q node charging circuits; and a second common control line for transferring the second common control signal from the common sensing circuit commonly to the first to fourth sensing QB node discharging circuits.

11. The gate driving circuit of claim 6, wherein the second logic unit is smaller in area than the first logic unit, and wherein the fourth logic unit is smaller in area than the second logic unit.

12. The gate driving circuit of claim 6, wherein the first logic unit includes a first circuit portion having a same structure as the second logic unit and a second circuit portion that is not included in the second logic unit, and wherein the third logic unit includes a third circuit portion having a same structure as the fourth logic unit and a fourth circuit portion that is not included in the fourth logic unit.

13. The gate driving circuit of claim 12, wherein the first logic unit includes a first individual logic unit and a first common logic unit,
  wherein the second logic unit includes a second individual logic unit having a same structure as the first individual logic unit,
  wherein the third logic unit includes a third individual logic unit and a third common logic unit,
  wherein the fourth logic unit includes a fourth individual logic unit having a same structure as the third individual logic unit,
  wherein the first individual logic unit includes a first QH control circuit configured to control a voltage level of a first QH node in the first scan driving circuit, a first normal Q node charging circuit configured to charge the first Q node during the display driving period, and a first normal Q node discharging circuit configured to discharge the first Q node during the display driving period;
  wherein the second individual logic unit includes a second QH control circuit configured to control a voltage level of a second QH node in the second scan driving circuit, a second normal Q node charging circuit configured to charge the second Q node during the display driving period, and a second normal Q node discharging circuit configured to discharge the second Q node during the display driving period;
  wherein the third individual logic unit includes a third QH control circuit configured to control a voltage level of a third QH node in the third scan driving circuit, a third normal Q node charging circuit configured to charge the third Q node during the display driving period, and a third normal Q node discharging circuit configured to discharge the third Q node during the display driving period; and
  wherein the fourth individual logic unit includes a fourth QH control circuit configured to control a voltage level of a fourth QH node in the fourth scan driving circuit, a fourth normal Q node charging circuit configured to charge the fourth Q node during the display driving period, and a fourth normal Q node discharging circuit configured to discharge the fourth Q node during the display driving period.

14. The gate driving circuit of claim 13, wherein the first common logic unit includes a first normal QB node discharging circuit configured to discharge the first QB node during the display driving period, a first QB node control circuit configured to charge the first QB node or control a voltage of the first QB node, and a first Q node control circuit configured to control a voltage of the first Q node, and
  wherein the third common logic unit includes a third normal QB node discharging circuit configured to discharge the third QB node during the display driving period, a third QB node control circuit configured to charge the third QB node or control a voltage of the third QB node, and a third Q node control circuit configured to control a voltage of the third Q node.

15. The gate driving circuit of claim 5, wherein k is 4 or 6.

16. The gate driving circuit of claim 1, wherein a turn-on level voltage period of each scan signal generated by the gate driving circuit have a longer horizontal time than one horizontal time 1H.

17. The gate driving circuit of claim 16, wherein each scan signal generated by the gate driving circuit overlaps an immediately subsequent scan signal.

18. A display device, comprising:
  a display panel including a plurality of scan lines and a plurality of subpixels; and
  a gate driving circuit disposed in a non-display area of the display panel and driving the plurality of scan lines,
  wherein the gate driving circuit includes:
    a first scan driving circuit configured to output an nth to (n+k−1)th scan signal to an nth to (n+k−1)th scan line among the plurality of scan lines;
    a second scan driving circuit configured to output an (n+k)th to (n+2k−1)th scan signal to an (n+k)th to (n+2k−1)th scan line among the plurality of scan lines;
    a third scan driving circuit configured to output an (n+2k)th to (n+3k−1)th scan signal to an (n+2k)th to (n+3k−1)th scan line among the plurality of scan lines;
    a fourth scan driving circuit configured to output an (n+3k)th to (n+4k−1)th scan signal to an (n+3k)th to (n+4k−1)th scan line among the plurality of scan lines; and
    a common sensing circuit commonly connected with the first scan driving circuit, the second scan driving circuit, the third scan driving circuit, and the fourth scan driving circuit, and configured to receive a line selection signal, and output a first common control signal and a second common control signal to the first scan driving circuit, the second scan driving circuit, the third scan driving circuit, and the fourth scan driving circuit,
  wherein during a sensing driving period in operation, one of the first scan driving circuit, the second scan driving circuit, the third scan driving circuit, and the fourth scan driving circuit is configured to output a scan signal to a corresponding scan line among 4k scan lines responsive to a reset signal is input.

19. The display device of claim 18, wherein the sensing driving period overlaps a blank period in operation.

20. The display device of claim 18, wherein each of the plurality of subpixels includes a light emitting element, a driving transistor for driving the light emitting element, a scan transistor controlling connection between a first node of the driving transistor and a data line, a sensing transistor controlling connection between a second node of the driving transistor and a reference voltage line, and a storage capacitor between the first node and second node of the driving transistor,
  wherein during the sensing driving period in operation, one of the first scan driving circuit, the second scan driving circuit, the third scan driving circuit, and the fourth scan driving circuit is configured to output a sensing driving scan signal to a scan line selected from among the 4k scan lines by a line selection signal, and
  wherein the sensing driving scan signal is applied to a gate node of the scan transistor in a target subpixel connected with the selected scan line.

21. The display device of claim 20, wherein in operation the sensing driving scan signal is further applied to a gate node of the sensing transistor in a target subpixel connected with the selected scan line.

22. The display device of claim 20, wherein the line selection signal is applied to the common sensing circuit.

23. The display device of claim 20, wherein the sensing driving period includes an initialization period and a tracking period, wherein during the initialization period in operation, a constant voltage-type reference voltage is applied to the reference voltage line connected with the target subpixel, and wherein during the tracking period after the initialization period in operation, a voltage of the reference voltage line connected with the target subpixel increases.

24. The display device of claim 23, wherein a rate at which the voltage of the reference voltage line increases varies based on mobility of the driving transistor included in the target subpixel.

25. The display device of claim 23, wherein during the tracking period in operation, the first node and the second node of the driving transistor are in a floating state, and wherein during the tracking period in operation, a voltage of the first node and a voltage of the second node of the driving transistor are both increased.

26. The display device of claim 18, wherein the first scan driving circuit includes: a first buffer group including an nth to (n+k−1)th scan output buffer electrically connected with the nth to (n+k−1)th scan lines, a first logic unit configured to control the first buffer group during a display driving period, and a first sensing unit configured to control the first buffer group during the sensing driving period;

wherein the second scan driving circuit includes: a second buffer group including an (n+k)th to (n+2k−1)th scan output buffer electrically connected with the (n+k)th to (n+2k−1)th scan lines, a second logic unit configured to control the second buffer group during the display driving period, and a second sensing unit configured to control the second buffer group during the sensing driving period, wherein the third scan driving circuit includes: a third buffer group including an (n+2k)th to (n+3k−1)th scan output buffer electrically connected with the (n+2k)th to (n+3k−1)th scan lines, a third logic unit configured to control the third buffer group during the display driving period, and a third sensing unit configured to control the third buffer group during the sensing driving period; and wherein the fourth scan driving circuit includes: a fourth buffer group including an (n+3k)th to (n+4k−1)th scan output buffer electrically connected with the (n+3k)th to (n+4k−1)th scan lines, a fourth logic unit configured to control the fourth buffer group during the display driving period, and a fourth sensing unit configured to control the fourth buffer group during the sensing driving period.

27. The display device of claim 26, wherein each of the nth to (n+k−1)th scan output buffers includes a pull-up transistor and a pull-down transistor, gate nodes of respective pull-up transistors of the nth to (n+k−1)th scan output buffers being commonly connected to a first Q node, and gate nodes of respective pull-down transistors of the nth to (n+k−1)th scan output buffers being commonly connected to a first QB node;

wherein each of the (n+k)th to (n+2k−1)th scan output buffers includes a pull-up transistor and a pull-down transistor, gate nodes of respective pull-up transistors of the (n+k)th to (n+2k−1)th scan output buffers being commonly connected to a second Q node, and gate nodes of respective pull-down transistors of the (n+k)th to (n+2k−1)th scan output buffers being commonly connected to a second QB node;

wherein each of the (n+2k)th to (n+3k−1)th scan output buffers includes a pull-up transistor and a pull-down transistor, gate nodes of respective pull-up transistors of the (n+2k)th to (n+3k−1)th scan output buffers being commonly connected to a third Q node, and gate nodes of respective pull-down transistors of the (n+2k)th to (n+3k−1)th scan output buffers being commonly connected to a third QB node; and wherein each of the (n+3k)th to (n+4k−1)th scan output buffers includes a pull-up transistor and a pull-down transistor, gate nodes of respective pull-up transistors of the (n+3k)th to (n+4k−1)th scan output buffers being commonly connected to a fourth Q node, and gate nodes of respective pull-down transistors of the (n+3k)th to (n+4k−1)th scan output buffers being commonly connected to a fourth QB node.

28. The display device of claim 26, wherein the second logic unit is smaller in area than the first logic unit, and wherein the fourth logic unit is smaller in area than the second logic unit.

* * * * *